(12) United States Patent
Venkumahanti et al.

(10) Patent No.: US 8,397,238 B2
(45) Date of Patent: Mar. 12, 2013

(54) THREAD ALLOCATION AND CLOCK CYCLE ADJUSTMENT IN AN INTERLEAVED MULTI-THREADED PROCESSOR

(75) Inventors: Suresh K. Venkumahanti, Austin, TX (US); Martin Saint-Laurent, Austin, TX (US); Lucian Codrescu, Austin, TX (US); Baker S. Mohammad, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 593 days.

(21) Appl. No.: 12/632,873

(22) Filed: Dec. 8, 2009

(65) Prior Publication Data

US 2011/0138393 A1   Jun. 9, 2011

(51) Int. Cl.
*G06F 9/46* (2006.01)
(52) U.S. Cl. ......... 718/104; 718/103; 712/214; 712/215
(58) Field of Classification Search ................. None
See application file for complete search history.

(56) References Cited

U.S. PATENT DOCUMENTS

| | | | |
|---|---|---|---|
| 2003/0028816 A1 | 2/2003 | Bacon | |
| 2006/0005051 A1 | 1/2006 | Golla et al. | |
| 2006/0095807 A1 * | 5/2006 | Grochowski et al. | 713/324 |
| 2008/0141062 A1 * | 6/2008 | Yamaoka | 713/501 |
| 2009/0070602 A1 * | 3/2009 | Ingle et al. | 713/300 |
| 2009/0125749 A1 | 5/2009 | Weiberle et al. | |
| 2009/0182987 A1 | 7/2009 | Mejdrich et al. | |
| 2009/0217277 A1 | 8/2009 | Johnson et al. | |
| 2009/0267649 A1 * | 10/2009 | Saint-Laurent et al. | 326/95 |
| 2009/0292907 A1 | 11/2009 | Schwinn et al. | |

OTHER PUBLICATIONS

International Search Report and Written Opinion—PCT/US2010/059579, ISA/EPO—Apr. 28, 2011.

* cited by examiner

*Primary Examiner* — Emerson Puente
*Assistant Examiner* — Sisley Kim
(74) *Attorney, Agent, or Firm* — Peter M. Kamarchik; Nicholas J. Pauley; Jonathan T. Velasco

(57) ABSTRACT

Methods, apparatuses, and computer-readable storage media are disclosed for reducing power by reducing hardware-thread toggling in a multi-threaded processor. In a particular embodiment, a method allocates software threads to hardware threads. A number of software threads to be allocated is identified. It is determined when the number of software threads is less than a number of hardware threads. When the number of software threads is less than the number of hardware threads, at least two of the software threads are allocated to non-sequential hardware threads. A clock signal to be applied to the hardware threads is adjusted responsive to the non-sequential hardware threads allocated.

39 Claims, 18 Drawing Sheets

THREAD ALLOCATION AND CLOCK CYCLE ADJUSTMENT IN AN INTERLEAVED MULTI-THREADED PROCESSOR

I. FIELD

The present disclosure is generally related to controlling clocking signals applied to one or more instruction pipelines in an interleaved multi-threaded processor.

II. DESCRIPTION OF RELATED ART

Multi-threaded processors may use an appreciable amount of power in toggling circuitry that advances software threads through execution stages of an instruction pipeline in a processing unit. When a multi-threaded processor is tasked with processing fewer software threads than the multi-threaded processor is configured to simultaneously process, toggling the circuitry as though the multi-threaded processor is fully loaded with software threads may consume more power than is necessary.

For example, a multi-threaded processor configured to accommodate six separate hardware threads may consume more power than necessary when it fully toggles the hardware threads when fewer than six software threads are executing. For example, if there is only one software thread executing, it may not be necessary to toggle the circuitry to advance the single software thread in the same manner as when a full complement of software threads are executing.

III. SUMMARY

Systems and methods for reducing power consumption by reducing toggling of circuitry to advance one or more software threads between execution stages in an instruction pipeline of a multi-threaded processor are disclosed. In various embodiments, when a number of hardware threads available in a multi-threaded processor is two or a higher integer multiple of a number of software threads being executed, the circuitry to advance the software threads between the execution stages in the instruction pipeline need not be toggled with every clock signal. Storage elements, such as flip flops, that are used to control the advance of the software threads between the execution stages of the instruction pipeline may be entered into a transparent state. With the storage elements in a transparent state, one or more clock cycles that ordinarily would advance the software threads between execution stages may be ignored to reduce toggling. To support reduced toggling, depending on how many more hardware threads there are than there are software threads executing, the software threads may be allocated to every second hardware thread, every third hardware thread, etc., so that the software threads can be executed with reduced toggling of the hardware threads.

In a particular embodiment, a method is disclosed that includes allocating software threads to hardware threads. The method includes identifying a number of software threads to be allocated. When the number of software threads is less than the number of hardware threads, at least two of the software threads are allocated to non-sequential hardware threads. A clock signal to be applied to the hardware threads is adjusted responsive to the non-sequential hardware threads allocated.

In another particular embodiment, the method includes an identifying step for identifying a number of software threads to be allocated. Upon determining that the number of software threads is not more than one-half a number of hardware threads, a non-sequential allocating step allocates at least two of the software threads to non-sequential hardware threads. An adjusting step adjusts a clock signal to be applied to the hardware threads responsive to the non-sequential hardware threads allocated.

In still another particular embodiment, a computer-readable medium is disclosed that stores instructions executable by a computing system. Instructions are included to identify a number of software threads to be allocated. Instructions determine that the number of software threads is not more than one-half of a number of hardware threads. Additional instructions sequentially allocate at least two of the software threads to the number of hardware threads when the number of software threads is more than one-half of the number of hardware threads. Further instructions non-sequentially allocate the software threads to non-sequential hardware threads when the number of software threads is less than the number of hardware threads.

In still another embodiment, a system is disclosed that allocates software threads to hardware threads. Identifying means identify a number of software threads to be allocated. Determining means determine that the number of software threads is less than a number of hardware threads. Allocating means allocate at least two of the software threads to non-sequential hardware threads. Clock signal adjusting means adjust a clock signal to be applied to the hardware threads responsive to the non-sequential hardware threads allocated.

In another embodiment, a method to control a multi-threaded processor is disclosed. At least one storage element in a clocking system is selectively placed in a transparent state based. The clock signal is configured to be adjustable based on software threads allocated to non-sequential hardware threads of the multi-threaded processor.

In yet another embodiment, a system is disclosed that includes an indicator configured to identify a number of active software threads to be executed via a number of hardware threads in a multi-threaded processor and to control a clock signal. An allocator is configured to allocate the active software threads to be executed among the hardware threads. At least one storage element is configured to assume a transparent state such that the at least one storage element buffers an applied data signal when the at least one storage element is in the transparent state.

In another embodiment, a method is disclosed that receives design information representing at least one physical property of a semiconductor device. The semiconductor device includes an indicator configured to identify a number of active software threads to be executed via a number of hardware threads in a multi-threaded processor. The semiconductor device also includes storage element logic configured to assume a transparent state such that at least one storage element buffers an applied data signal when the at least one storage element is in the transparent state.

One particular advantage of disclosed embodiments is the saving of power expended in unnecessarily toggling hardware threads to advance software threads between execution stages. When the number of hardware threads is an integer multiple of two or more of the number of software threads being executed, the hardware threads may be toggled less frequently because the software threads may advance between execution stages without being latched and clocked. For example, if a multi-threaded processor supports execution of six hardware threads but only one software thread is presented for execution, the software thread may pass unlatched between the six hardware threads, and the hardware threads may be toggled one-sixth as often as if there were six software threads executing. Similarly, if only two software threads are presented for execution, the hardware threads may be toggled one-third as often as if there were six software threads executing. Also, if only three software threads are presented for execution, the hardware threads may be toggled one-half as often as if there were six software threads executing. In each case, because the hardware threads are not toggled as frequently, at least a portion of the power that would have been consumed in toggling the hardware threads may be saved.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 12:
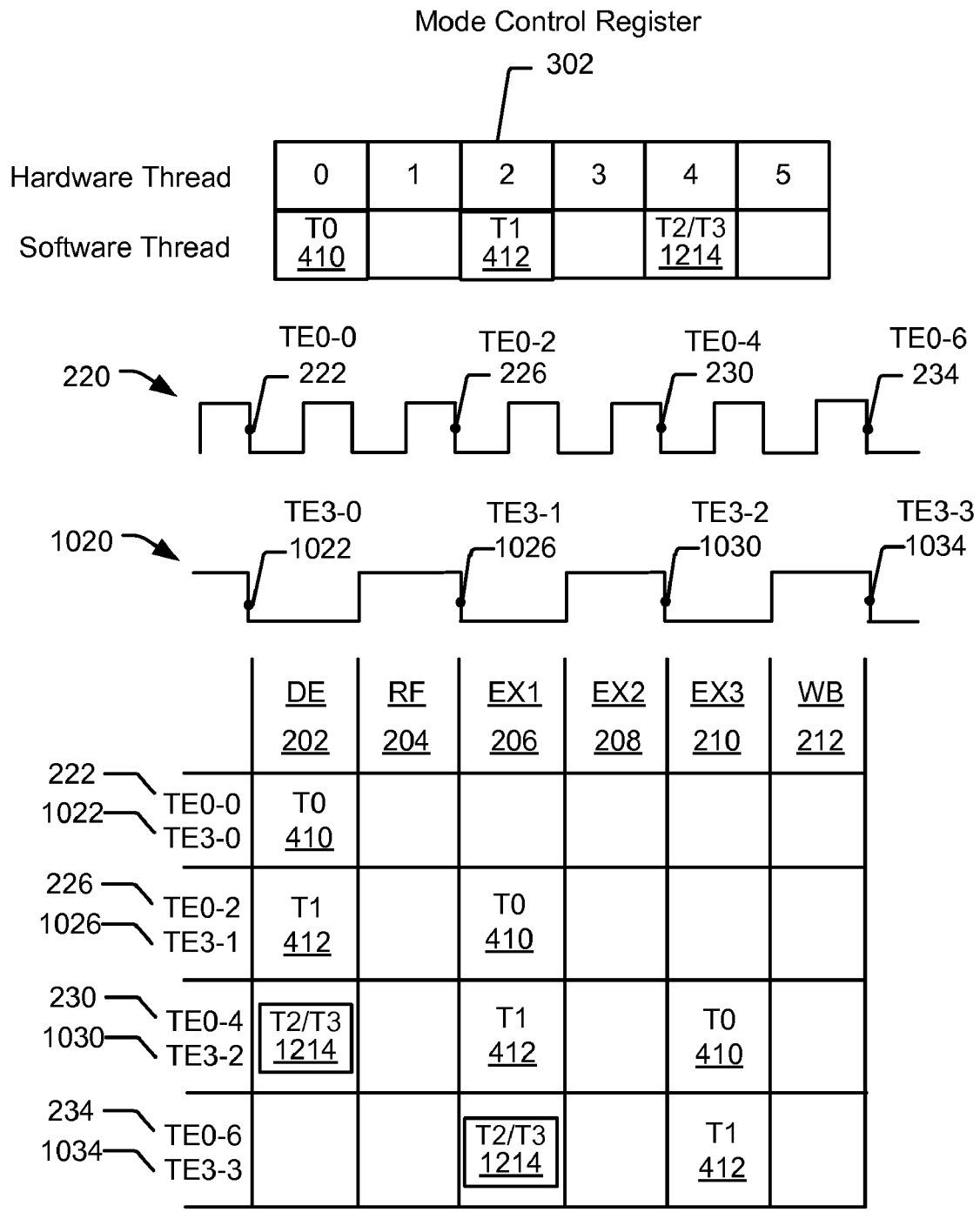
FIG. 12 is a diagram of a mode control register used to selectively combine a pair of four software threads and allocate the software threads to three non-sequential hardware threads of the six available hardware threads operating according to a particular embodiment of a method of thread allocation and clock cycle adjustment in an interleaved multi-threaded processor.
Figure 13:
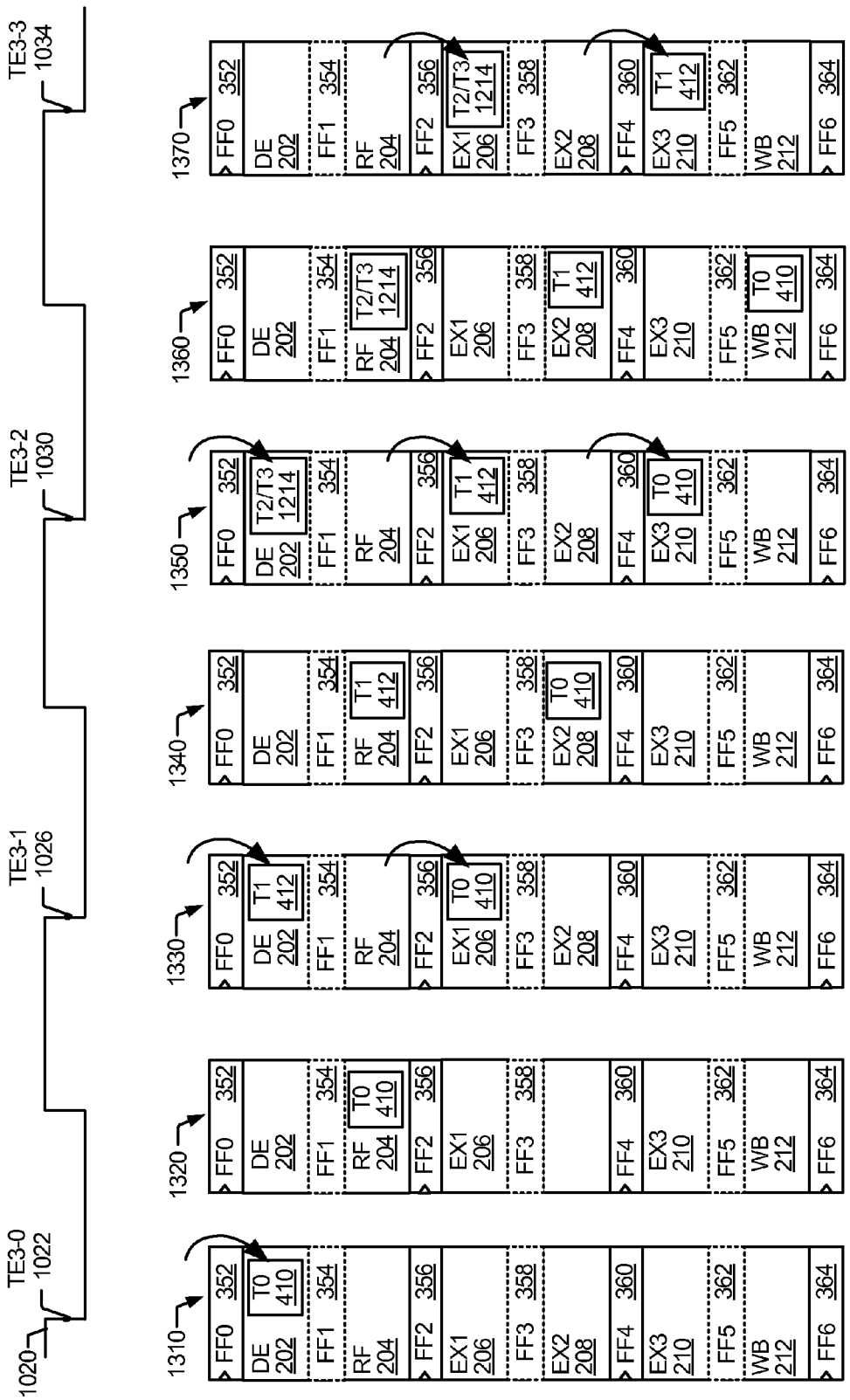
Figure 14:
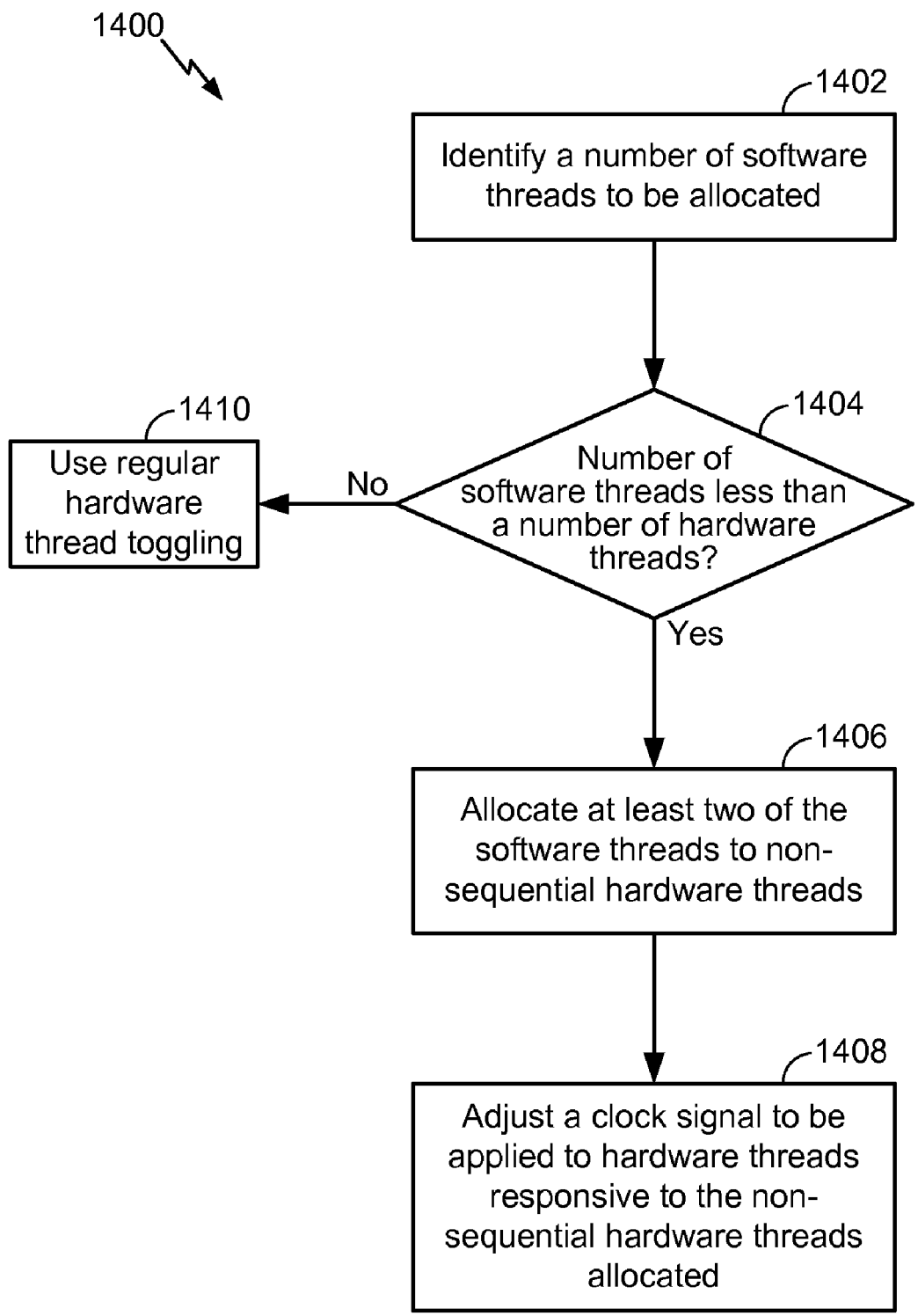
Figure 15:
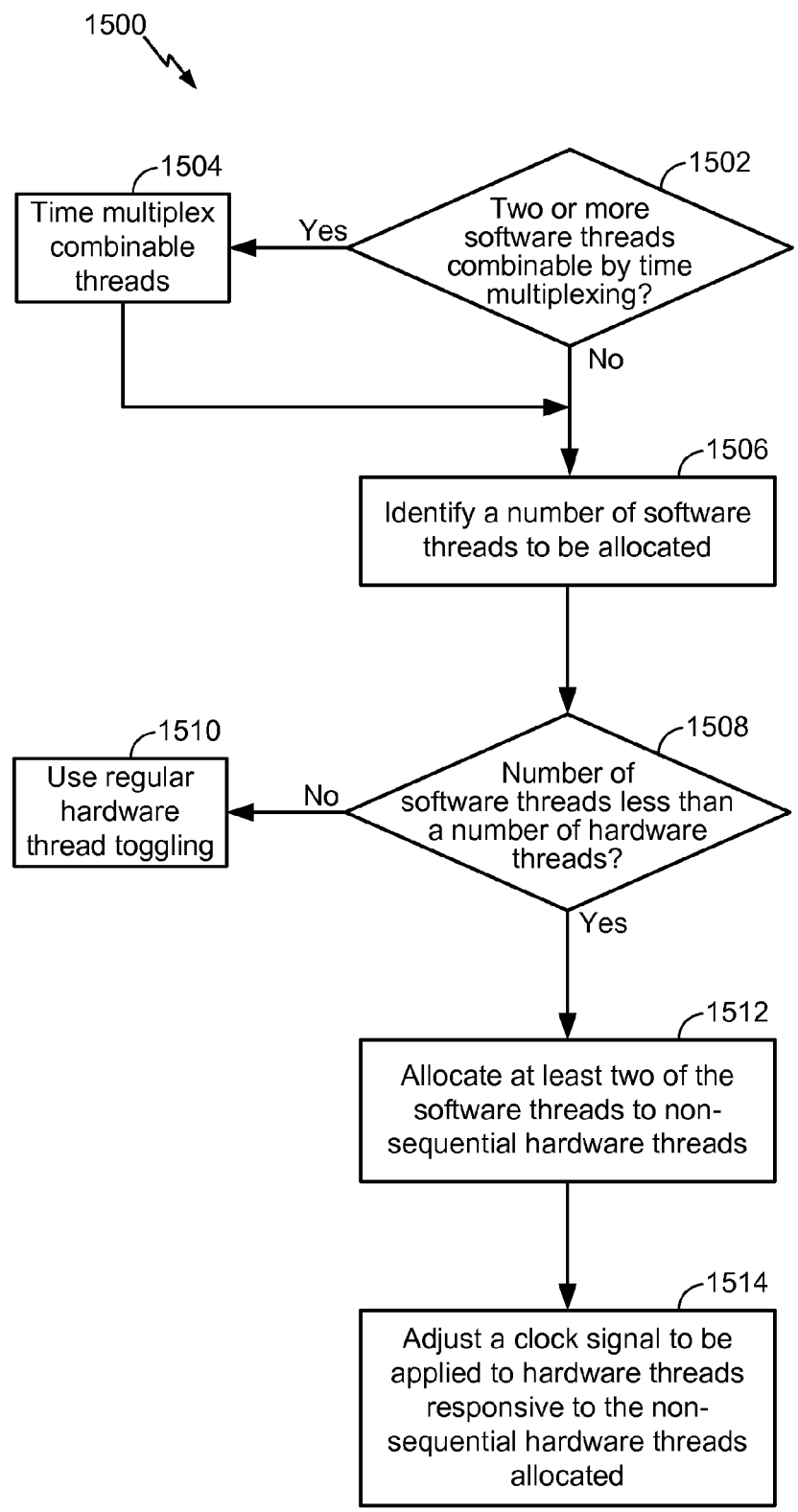
Figure 16:
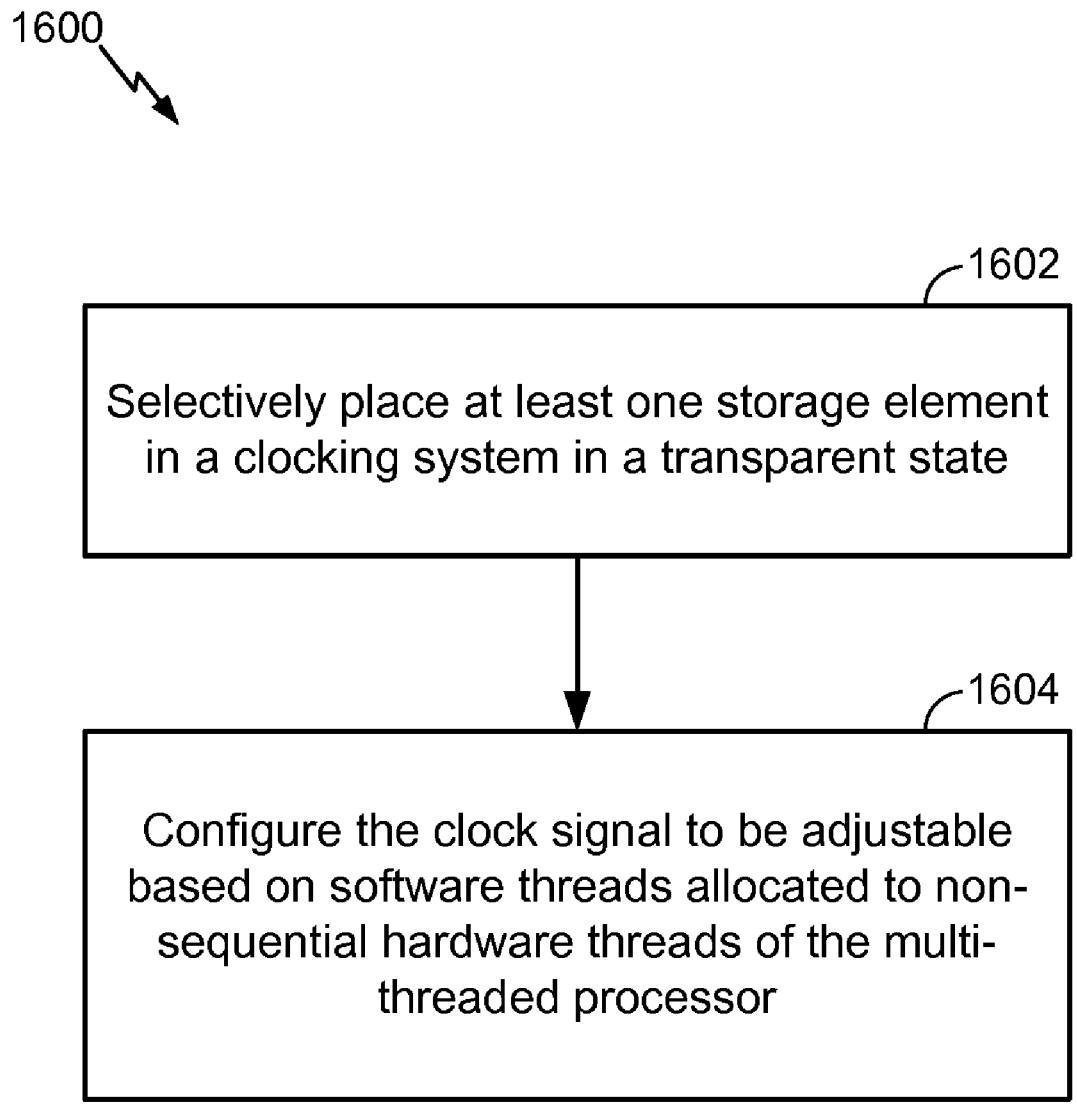
Figure 17:
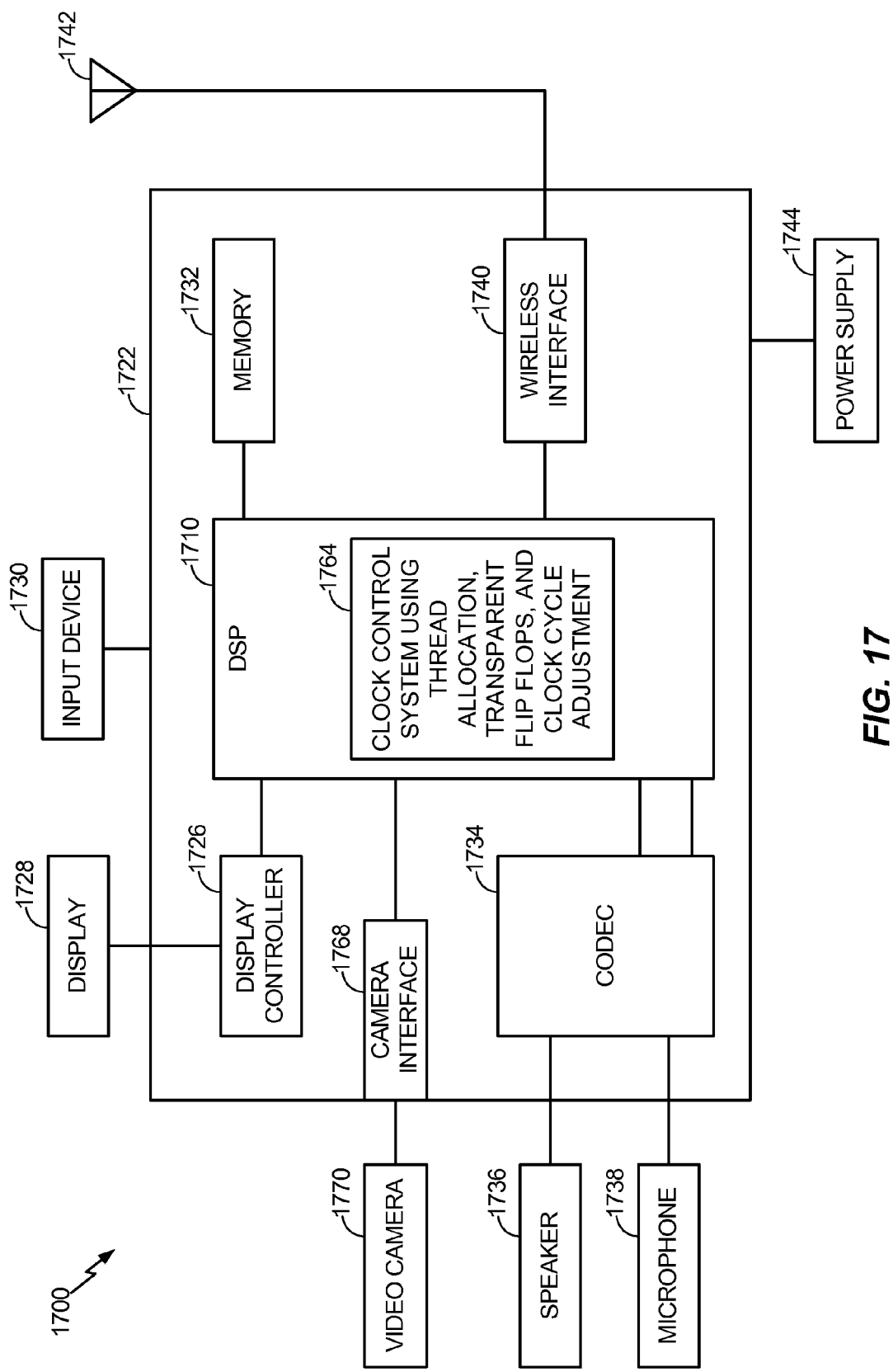
Figure 18:
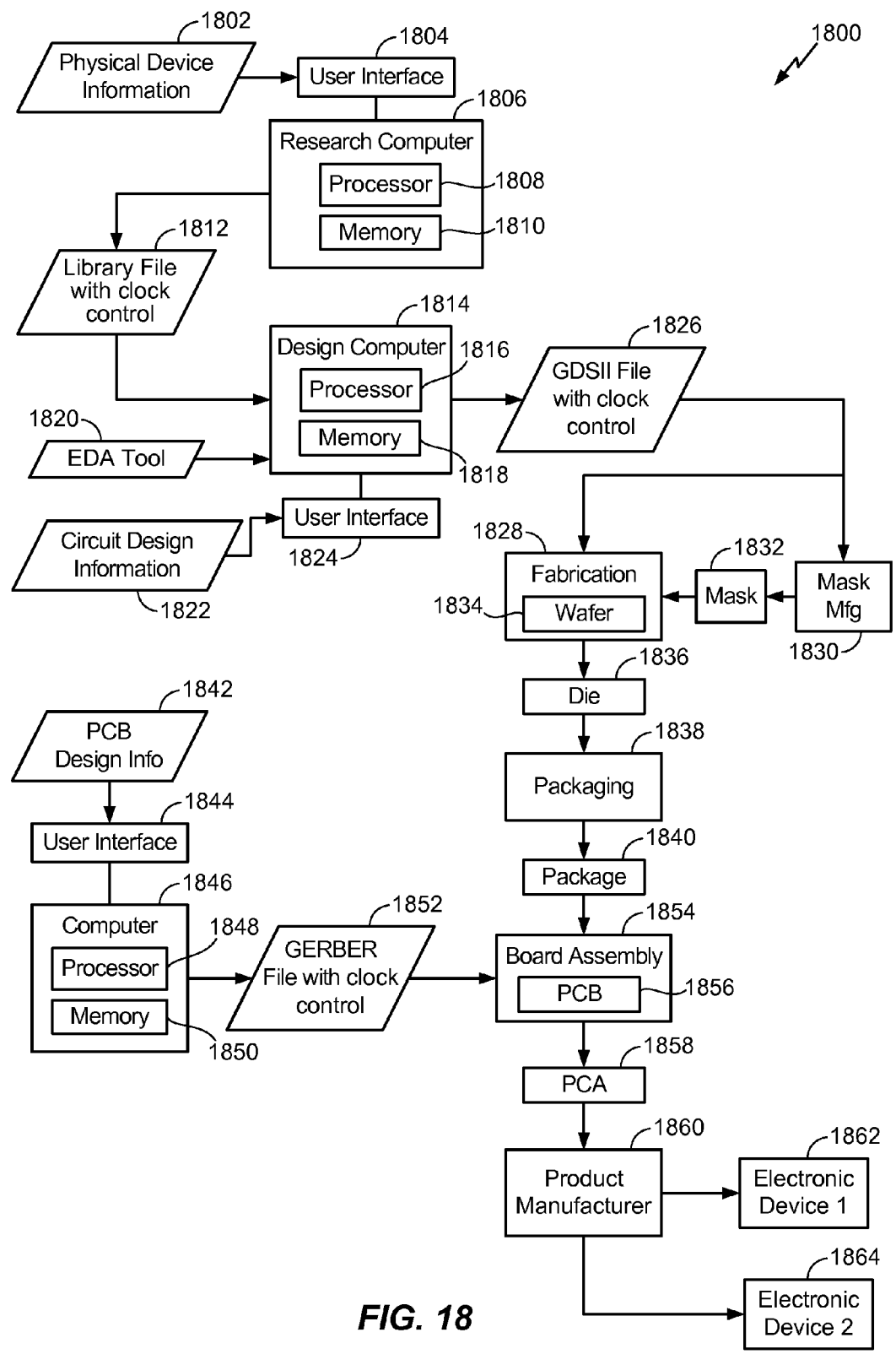

FIG. 13 is a diagram of an instruction pipeline advancing the three non-sequentially allocated software threads, including the pair of software threads of FIG. 12 combined into a single software thread, between execution stages according to a reduced clock signal operating according to a particular embodiment of a method of thread allocation and clock cycle adjustment in an interleaved multi-threaded processor;

FIG. 14 is a flow diagram of another particular illustrative embodiment of a method of thread allocation and clock cycle adjustment in an interleaved multi-threaded processor;

FIG. 15 is a flow diagram of another particular illustrative embodiment of a method of thread allocation and clock cycle adjustment in an interleaved multi-threaded processor when two or more software threads are time multiplexed;

FIG. 16 is a flow diagram of another particular illustrative embodiment of a method of thread allocation and clock cycle adjustment in an interleaved multi-threaded processor;

FIG. 17 is a block diagram of a communications device that includes a processor using a particular illustrative embodiment of thread allocation and clock cycle adjustment in an interleaved multi-threaded processor; and FIG. 18 is a data flow diagram of a method of manufacturing electronic devices that include a particular illustrative embodiment of thread allocation and clock cycle adjustment in an interleaved multi-threaded processor.

V. DETAILED DESCRIPTION

In a multi-threaded processor, embodiments of the present disclosure can save power by reducing unnecessary toggling of hardware threads to advance software threads between execution stages in an instruction pipeline. When a number of software threads is half or less than half the number of hardware threads supported by the processing system, the hardware threads do not all need to be toggled with each system clock cycle. For example, in a six-thread interleaved multi-threaded processor (IMT), if there are only one, two, or three software threads executing, the hardware threads need not be toggled on each clock cycle to advance the software threads to the next execution stage in the instruction pipeline. In the case of a single software thread, the hardware threads may only be toggled once for every six clock cycles because the single software thread can pass unlatched between execution stages in the instruction pipeline without toggling the hardware threads to advance the software thread between execution stages. Similarly, in the case of two software threads, the software threads may be allocated to every third hardware thread and the hardware thread may be toggled every three clock cycles. In the case of three software threads, the software threads may be allocated to every other hardware thread and the hardware threads may be toggled every other clock cycle.

According to another particular embodiment, when the number of hardware threads is not an integer multiple of the number of software threads executing, but some of the software threads may be executed at less than full execution speeds, reduced toggling to reduce power consumption may still be used. Software threads that may be executed at less than full execution may be time-multiplexed and, thus, presented as a single software thread so that the number of hardware threads may be an integer multiple of the number of software threads executing.

For example, if there are four software threads executing on a system with six hardware threads, according to the previously described embodiments, the four software threads would be sequentially allocated to hardware threads and the hardware threads would be fully toggled. However, if two of the software threads may be executed at less than full execution speeds, these two threads may be time-multiplexed and presented as one software thread, resulting in a total of three effective software threads executing. The three effective software threads may be allocated to every other hardware thread, thereby saving toggling of the hardware threads. Similarly, if there are five software threads executing, but four of the software threads may be executed at less than full execution speed, these two pairs of software threads may be time multiplexed and presented as two software threads, again resulting in a total of three effective software threads executing. The three effective software threads may be allocated to every other hardware thread, thereby saving toggling of the hardware threads.

The number of software threads to be executed may be identified and, based on that identification, software threads are allocated among hardware threads and it may be determined how many clock cycles may be skipped in toggling the hardware threads. To skip clock cycles, storage elements, such as flip flops or pulsed flip flops may be used in a clock system to selectively toggle respective hardware threads in response to a clock cycle. The storage elements may receive control signals to enter a transparent mode when the storage elements are not to toggle a hardware thread to advance the software thread to a next execution stage. In the transparent mode, the storage elements act as a buffer that enable the software thread to flow between adjacent execution stages as though the adjacent stages were an extended execution stage in which multiple pipeline operations may be performed.

Figure 1:
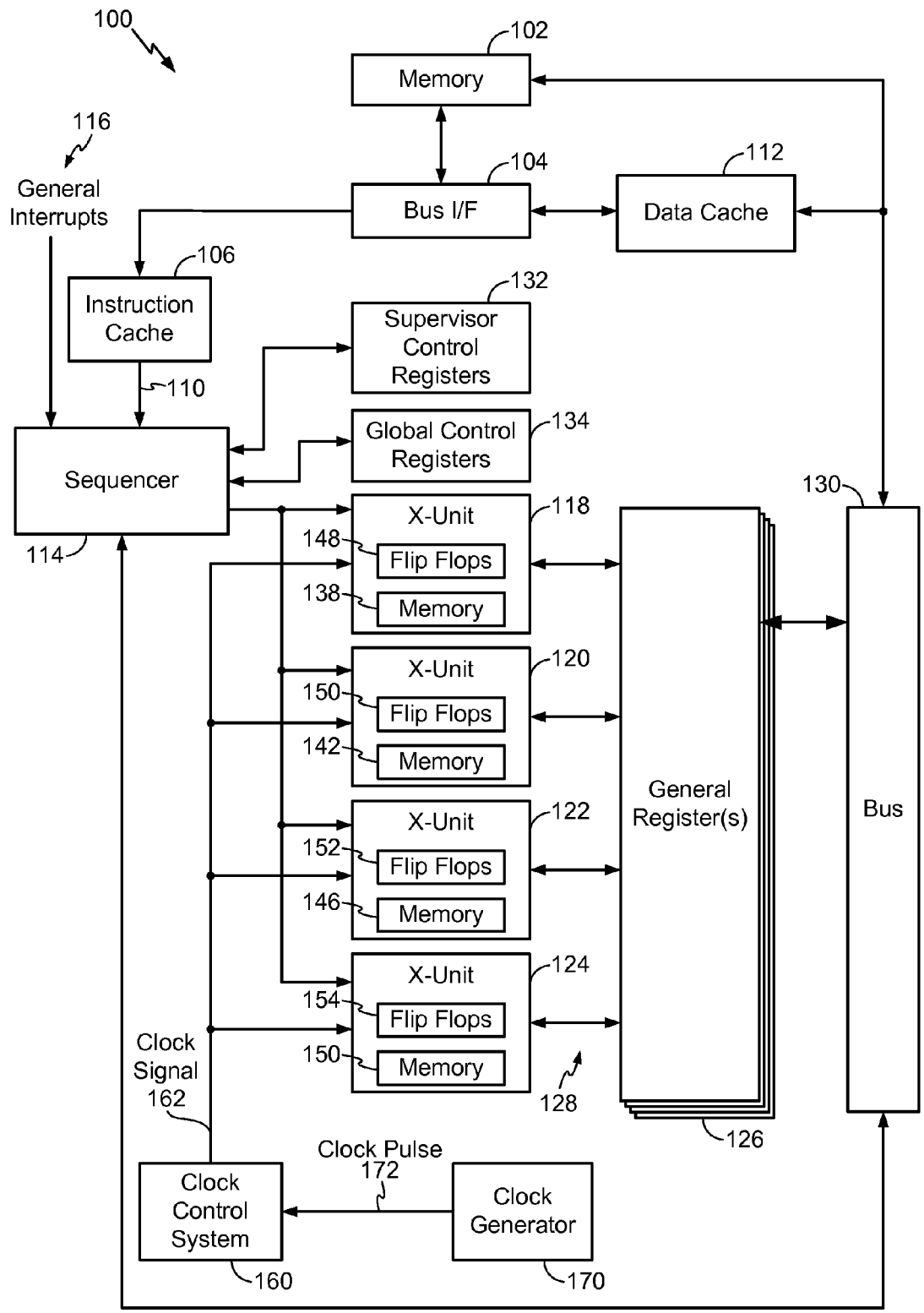
FIG. 1 is a block diagram of a particular illustrative embodiment of a system including a clock control system in an interleaved multi-threaded processor.

FIG. 1 is a block diagram of a particular illustrative embodiment of a processing system 100 that includes a toggling system that employs flip flops or other storage elements that may selectively enter a transparent mode. By having the capability to selectively enter the storage elements in a transparent mode, hardware threads may be selectively toggled in advancing software threads between execution stages in an instruction pipeline. The processing system 100 includes a memory 102 that is adapted to communicate with an instruction cache 106 and a data cache 112 via a bus interface 104. The instruction cache 106 is coupled to a sequencer 114 by a bus 110. Additionally, the sequencer 114 is adapted to receive interrupts, such as general interrupts 116, which may be received from an interrupt register. The sequencer 114 is also coupled to supervisor control registers 132 and global control registers 134. The sequencer 114 is coupled to a first instruction execution unit 118, a second instruction execution unit 120, a third instruction execution unit 122, and a fourth instruction execution unit 124 that may be used to execute multiple operations in parallel. Each instruction execution unit 118, 120, 122, and 124 can be coupled to a general register file 126 via a second bus 128. The general register file 126 can also be coupled to the sequencer 114, the data cache 112, and the memory 102 via a third bus 130. Supervisor control registers 132 and the global control registers 134 may store bits that may be accessed by control logic within the sequencer 114 to determine whether to accept interrupts and to control execution of instructions.

In a particular embodiment, the instruction cache 106 is coupled to the sequencer 114 via a plurality of current instruction registers, which may be coupled to the bus 110 and associated with particular threads of the processing system 100. In a particular embodiment, the processing system 100 is an interleaved multi-threaded processor including six hardware threads configured to concurrently support up to six software threads. The processing system 100 sequentially executes instructions from each of the different threads. Interleaving processing of the software threads enables a process to be clocked at an aggressive clock cycle to efficiently utilize the processing capabilities of a hardware thread. For example, while a relatively slow data read or write operation is being processed for one software thread, an instruction from another software thread may be executed by the processor without waiting for completion of the data read or write operation.

In a particular embodiment, the processing system 100 is adapted to receive instructions executable by the execution units 118, 120, 122, and 124. The first packet of instructions can include multiple instructions that may be provided to the execution units 118, 120, 122 and 124. The execution units 118, 120, 122, and 124 may process instructions included in each of a plurality of execution stages of an instruction pipeline. In one embodiment, the stages include a decode stage, a register file access stage, multiple execution stages, and a write back stage, each of which is further described with reference to FIG. 2.

According to a particular illustrative embodiment, the sequencer 114 or another control logic device or an operating system executing on the processing system is configured to identify a number of software threads to be executed and allocated among a number of hardware threads and, ultimately, to be executed by each of the execution units 118, 120, 122, and 124. In one particular embodiment, the processing system is configured to include six hardware threads configured to execute up to six software threads of which the instructions may be interleaved to take advantage of the performance and aggressive clocking of the execution units 118, 120, 122, and 124 of the processing system 100. As further described below, in a processing system configured to execute up to six software threads, embodiments of the present disclosure facilitate allocation of one, two, or three software threads and reduced toggling of the hardware threads to advance the software threads to conserve power. According to embodiments of the present disclosure, a processing system supporting execution of multiple software threads may facilitate software thread allocation and reduced toggling when the number of available hardware threads is an integer multiple of two or more of the number of software threads executing.

According to a another particular illustrative embodiment, the sequencer 114 or another control logic device or an operating system is also configured to identify when, although the number of hardware threads is not an integer multiple of the number of software threads, when some of the software threads may be time multiplexed and combined. By recognizing software threads that may be combined, e.g., software threads that may be executed at less than full execution speeds, these software threads may be may be combined so that the number of hardware threads will be an integer multiple of the number of software threads. Combining these software threads enables non-sequential thread allocation and reduced hardware thread toggling, as described below with reference to FIGS. 12 and 13.

According to a particular illustrative embodiment, clocking of the execution units 118, 120, 122, and 124 is controlled by sets of storage elements such as flip flops 148, 150, 152, and 154, respectively, that control the passage of instructions between execution stages in the instruction pipeline as further described below with reference to FIGS. 3 and 8-11. The sets of flip flops 148, 150, 152, and 154 may include pulsed flip flops or other storage elements that are configured to receive a clock signal 162. A clock control system 160 adjusts and supplies the clock signal 162 to the sets of flip flops 148, 150, 152, and 154. A clock generator 170 supplies a clock pulse 172 to the clock control system 160 and the clock control system 160 selectively generates the clock signal 162 based on the clock pulse 172, as is further described below. As also is further described below, the clock control system 160 may include one or more regional clock buffers and one or more local clock buffers to selectively communicate the clock signal 162 to one or more of the flip flops 148, 150, 152, and 154. The clock signal 162 selectively causes flip flops within the sets of flip flops 148, 150, 152 and 154 to enter a transparent or pass-through state.

By causing the selected flip flops to enter the transparent state, buffers in the clocking system (as explained further below) that conventionally latch data signals between the execution stages may allow data signals to flow through multiple execution stages unclocked. As described with reference to FIG. 2, each of the execution stages performs a designated operation or type of operation. However, according to embodiments of the disclosure, by allowing the data signals to flow unclocked from one execution stage to the next, each of the execution stages serves as an extended execution stage in which multiple operations are performed. When the number of hardware threads is an integer multiple of the number of software threads executing (including time multiplexed, combined software threads executing as a single effective software thread), data signals may be permitted to remain in an extended execution stage without toggling the data signals with each clock pulse. By not toggling the data signals through the execution stages with each clock pulse, at least a portion of the power used to toggle the data signals through each execution stage with each clock pulse may be saved.

Figure 2:
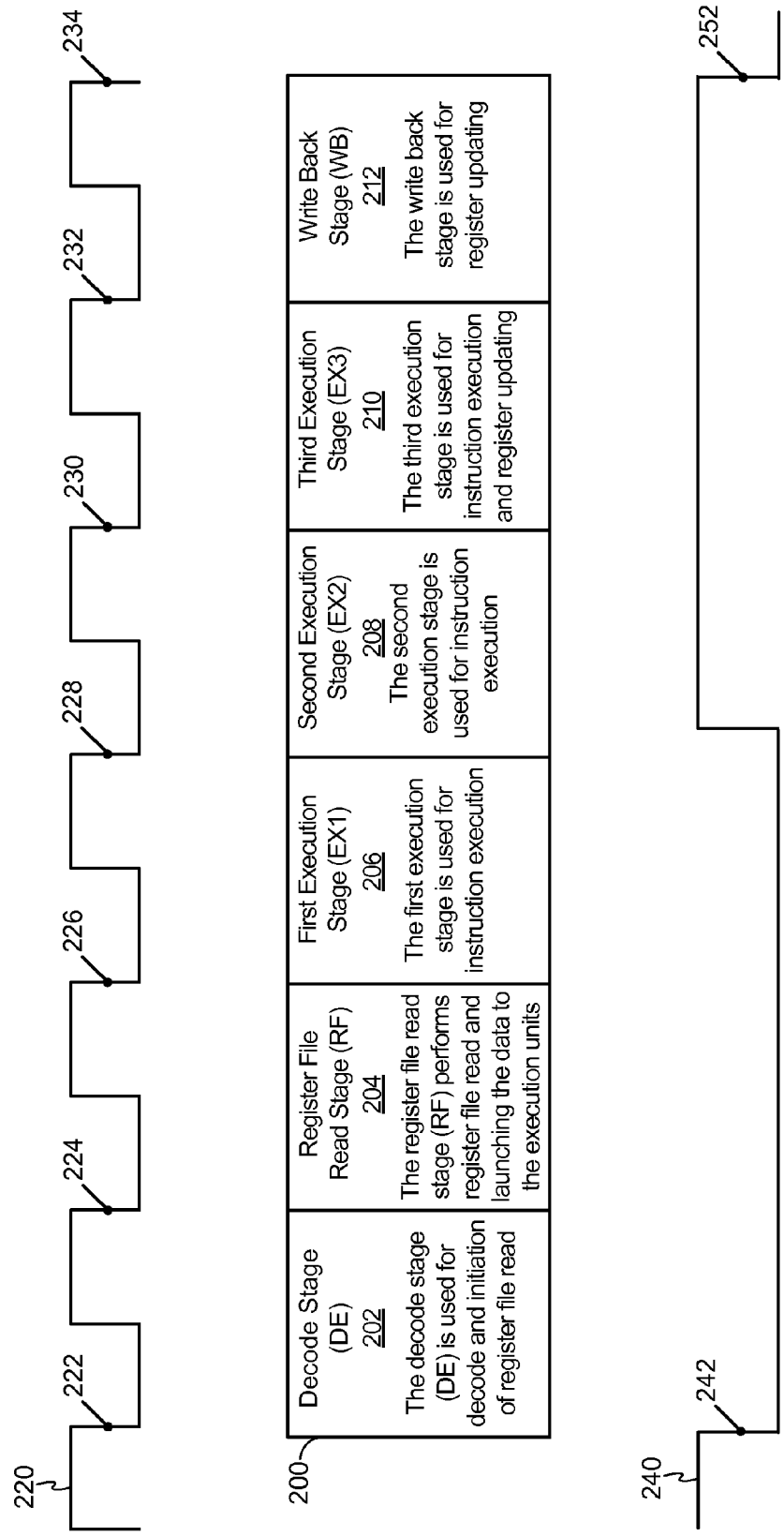
FIG. 2 is a timing diagram of a particular illustrative embodiment of a method of thread allocation and clock cycle adjustment in an interleaved multi-threaded processor.

FIG. 2 is a timing diagram of a particular illustrative embodiment of an instruction pipeline 200 through which data signals advance through a plurality of execution stages 202, 204, 206, 208, 210 and 212. The instruction pipeline 200 includes a decode stage 202 used for decoding an initiation of a register file read operation to retrieve operands and data to facilitate execution of a software thread assigned to the instruction pipeline. A register read file stage 204 performs the reading of the register file and causes data to be launched to the execution stages. A first execution stage 206 is used for instruction execution. A second execution stage 208 also is used for instruction execution. A third execution stage 210 also is used for instruction execution. The third execution stage 210 may also be used for register updating. A write back stage 212 is used for register updating to reflect changes to contents of the registers as a result of the execution of the instructions during the preceding execution of instructions. The six execution stages 202, 204, 206, 208, 210, and 212 represent execution stages supported, in one embodiment, by six available hardware threads.

Data signals are toggled and advanced between each of the plurality of execution stages 202, 204, 206, 208, 210, and 212 in the instruction pipeline 200 by a plurality of flip flops or other storage elements as described with reference to FIG. 3 in response to each of a plurality of applied pulses of a clock signal 220. For example, as shown in FIG. 2, the execution stages are toggled by each of the trailing edges 222, 224, 226, 228, 230, and 232 of the clock signal 220 to pass the data signals between the execution stages 202, 204, 206, 208, 210, and 212. The data signals are latched and toggled between each of the execution stages 202, 204, 206, 208, 210, and 212 because a next data signal may follow each preceding data signal in each successive execution stage. However, when there are fewer software threads executing than there are available hardware threads to execute the software threads, a software thread may be permitted to pass unlatched between at least some of the execution stages 202, 204, 206, 208, 210, and 212 because there may be no next successive thread to immediately follow in the execution stages 202, 204, 206, 208, 210, and 212.

When there are fewer software threads executing than there are available hardware threads as represented by the execution stages 202, 204, 206, 208, 210, and 212, the flip flops ordinarily used to advance software threads through the execution stages 202, 204, 206, 208, 210, and 212 need not be used to latch the software threads between execution stages with each of the trailing edges 222, 224, 226, 228, 230, and 232 of the clock pulse 220. For example, when a single software thread is executing, the software thread may pass through each of the execution stages 202, 204, 206, 208, 210, and 212 unlatched and unclocked. Thus, assuming a clock generator 170 (FIG. 1) for a system generates the clock signal 220, the instruction pipeline would only have to be toggled at a first trailing edge 222 and a seventh trailing edge 234 of the clock signal 220. Thus, the instruction pipeline could be toggled by a second clock signal 240 that clocks at one-sixth the speed of the clock signal 220. The second clock signal 240 would have only two trailing edges including a first trailing edge 242 and a second trailing edge 252 that correspond with the first trailing edge 222 and the seventh trailing edge 234 of the clock signal 220. Clocking the instruction pipeline 200 at one-sixth the speed of the original clock signal 220 may result in power savings.

Similarly, as further described below, in a system where two or three software threads are executing in a system supporting six hardware threads including six execution stages, the instruction pipeline 200 could also be toggled at a slower clock rate. For example, when there are only two software threads executing, if the software threads are non-sequentially allocated so that the first software thread were to pass through the first three execution stages 202, 204, and 206 of the instruction pipeline 200 before the second software thread were presented for execution, the instruction pipeline would only have to be toggled twice during the execution of the first software thread. Toggling the instruction pipeline twice would result in the instruction pipeline being toggled at one-third of the speed of the clock signal 220.

As a further example, when there are only three software threads executing, if the software threads are allocated so that the first software thread were to pass through the first two execution stages 202 and 204 of the instruction pipeline 200 before the second software thread was presented for execution, and the first software thread were to pass the next two execution stages 206 and 208 and the second software thread were to pass the first two execution stages 202 and 204 before the third software thread was presented for execution, the instruction pipeline would only have to be toggled three times during the execution of the first software thread. Toggling the instruction pipeline three times would result in the instruction pipeline being toggled at one-half of the speed of the clock signal 220. The allocation of software threads and the use of flip flops or other storage elements between execution stages that selectively enter a transparent mode to facilitate reduced toggling are described with reference to the following figures.

Figure 3:
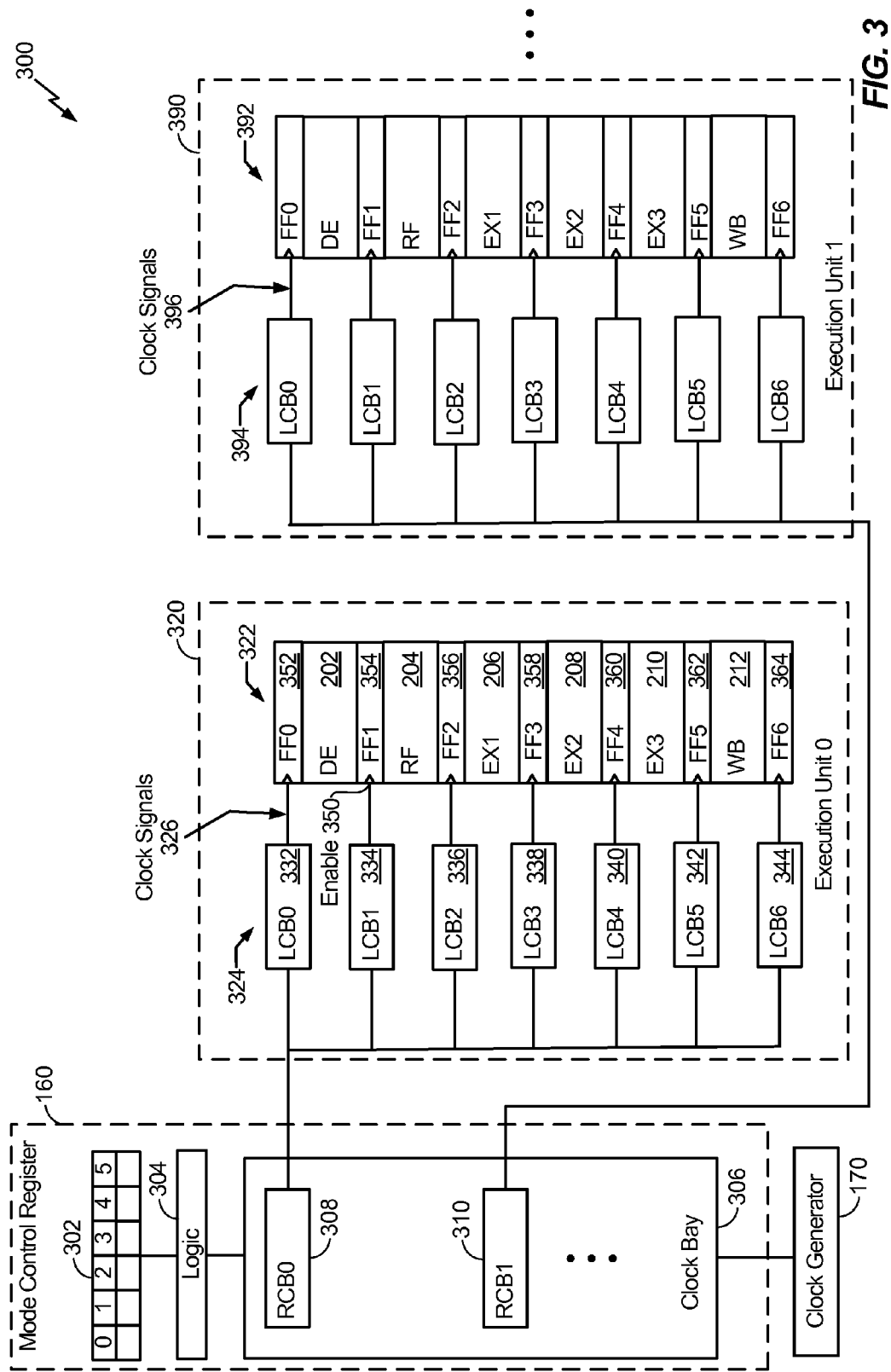
FIG. 3 is a block diagram of a particular embodiment of a system of thread allocation and clock cycle adjustment in an interleaved multi-threaded processor.

FIG. 3 is a block diagram of a system 300 including a clock control system 160 that operates with two exemplary execution units 320 and 390 to support reduced toggling within the instruction pipelines 322 and 392, respectively, of the execution units 320 and 390. The system 300 may include any number of execution units, each of which may support the execution of any number of hardware threads. The clock control system 160 receives a clock pulse from a clock generator 170 and generates clock signals to the execution units 320 and 390. The clock control system 160 includes a mode control register 302, that, in one particular illustrative embodiment, is used to track which software threads are executing in which hardware thread. In an exemplary system providing six hardware threads, the mode control register 302 includes six positions 0, 1, 2, 3, 4, and 5. Depending on the number of software threads presented for execution, the software threads are allocated to different positions in the mode control register 302 as further described below with reference to FIGS. 4-11. The number of software threads presented for execution are identified and allocated to positions in the mode control register 302 by an allocator in the operating system or in hardware logic configured to recognize and allocate the software threads.

The clock control system 160 includes logic 304 responsive to the allocation of software threads in the mode control register 302 to control the operation of a clock bay 306 in selectively reducing the toggling rate of the execution pipelines 322 and 392. Specifically, the logic 304 is configured to direct regional clock buffers (RCBs) 308 and 310 to selectively adjust the clock signals generated by the local clock buffers (LCBs) 324 and 394 of the execution units 320 and 390, respectively. Thus, the RCBs 308 and 310 cause the LCBs 324 and 394 to reduce the toggling of the instruction pipelines 322 and 392 when, in a system supporting six hardware threads, there are one, two, or three software threads executing.

The LCBs 324 and 394 facilitate selectively reducing the clock rate by controlling the clock signals 326 and 396 to flip flops or other storage elements that latch data signals between the execution stages in the instruction pipelines 322 and 392. Taking the example of Execution Unit 0 320, a flip flop (FF) latches data signals between each of the execution stages of the instruction pipeline 322. LCB0 332 controls FF0 352 in latching data signals into the decode stage (DE) 202. LCB1 334 controls FF1 354 in latching data signals into the register file read stage (RF) 204. LCB2 336 controls FF2 356 in latching data signals into the first execution stage (EX1) 206. LCB3 338 controls FF3 358 in latching data signals into the second execution stage (EX2) 208. LCB4 340 controls FF4 360 in latching data signals into the third execution stage (EX3) 210. LCB5 342 controls FF5 362 in latching data signals into the write back stage (WB) 212. LCB6 344 controls FF6 364 in latching data signals out of WB 212.

When the number of software threads executing permits reduced toggling of the instruction pipeline 322, LCB0 332, LCB1 334, LCB2 336, LCB3 338, LCB4 340, and LCB 5 342 selectively place FF0 352, FF1 354, FF2 356, FF3 358, FF4 360, and FF5 362, respectively, into a transparent mode that enables data signals to advance to a next execution stage unlatched and unclocked. As in the example described with reference to FIG. 2 in which only one software thread executes, each of FF0 352, FF1 354, FF2 356, FF3 358, FF4 360, and FF5 362 are selectively placed in a transparent mode to enable the data signals to advance unlatched into DE 202 (in the case of FF0 352) and between the execution stages DE 202, RF 204, EX1 206, EX2 208, EX3 210, and WB 212, respectively. In a transparent state, flip flops FF0 352, FF1 354, FF2 356, FF3 358, FF4 360, and FF5 362; act as buffers enabling the unclocked flow of data signals. For example, when FF0 352, FF1 354, FF2 356, FF3 358, FF4 360, and FF5 362 include pulsed flip flops or similar storage elements, LCB0 332, LCB1 334, LCB2 336, LCB3 338, LCB4 340, and LCB 5 342 apply high signals to an enable input, such as enable input 350 of FF1 354, that cause the flip flops to enable free advancement of data signals through the flip flops as long as the enable input remains active.

FIGS. 4-11 illustrate embodiments of the allocation of software threads based on the number of software threads executing and the toggling of the software threads through an instruction pipeline facilitated by the allocation of the software threads. FIGS. 4-11 illustrate examples in which there are six hardware threads supporting six different execution stages, as previously described. According to a particular illustrative embodiment, the reduction in clocking available is a function of the number of software threads in proportion to the number of available hardware threads. Thus, if a system, for example, supported two, four, or eight hardware threads, or any other number of hardware threads, the allocation of software threads and the resulting change in clocking of the hardware threads would be different than for a system supporting six hardware threads.

According to a particular embodiment, the allocation of software threads as described below is an adaptive process. Thus, when a number of software threads executing should increase or decrease, methods and systems of the present disclosure identify the change in the number of threads and adaptively allocate subsequent software threads accordingly. Thus, when a number of software threads executing drops from six software threads executing (as in the example of FIGS. 4-5) to one software thread executing (as in the example of FIGS. 6-7), a system will adapt to the decreasing number of software threads and will allocate software threads and adjust a clock signal accordingly. For further example, if the number of software threads executing increases from two software threads executing (as in the example of FIGS. 8-9) to three software threads executing (as in the example of FIGS. 10-11), a system will adapt to the increasing number of software threads and will allocate software threads and adjust a clock signal accordingly. In such cases, the system will allocate software threads sequentially or non-sequentially based on the number of software threads executing, as explained further below.

Figure 4:
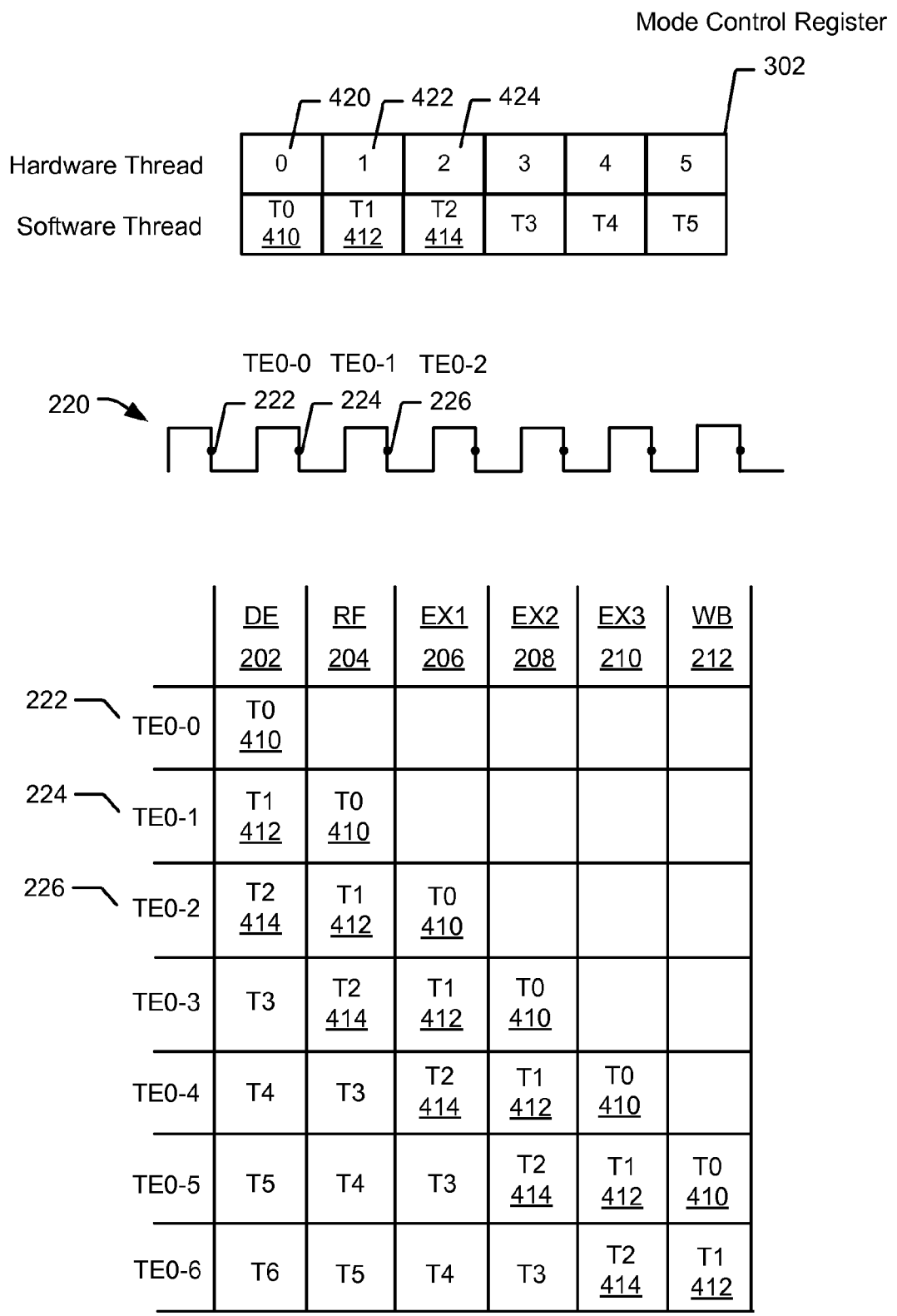
FIG. 4 is a diagram of a mode control register used to selectively allocate six software threads sequentially among six available hardware threads operating according to a particular embodiment of a method of thread allocation and clock cycle adjustment.

FIG. 4 illustrates the allocation of software threads among hardware threads according to a particular illustrative embodiment when the number of hardware threads is not an integer multiple of two or more of a number of software threads presented for execution. (In the example of FIG. 4, it is assumed that all the software threads presented for execution are designated to execute at full execution speed and, thus, none of the software threads may be time multiplexed and combined into a single effective software thread, as described below with reference to FIGS. 12 and 13.) According to a particular illustrative embodiment, a determination of the number of software threads relative to the number of hardware threads is made by an operating system or hardware logic. In a particular illustrative embodiment in which there are six hardware threads, if there are four or more software threads presented for execution, a configuration of the mode control register 302 shows the software threads being sequentially allocated among the available hardware threads. Thus, for example, a first software thread T0 410 is allocated to hardware thread 0 420, a second software thread T1 412 is allocated to hardware thread 1 422, a third software thread T2 414 is allocated to hardware thread 2 424, etc.

Because the number of hardware threads is not an integer multiple of two or more of a number of software threads presented for execution, a full-speed clock signal, such as the clock signal 220 is used to toggle the hardware threads. According to one embodiment, the clock signal 220 is used to latch the data signals between execution stages in the instruction pipeline with each trailing edge of the first clock signal (TE0) 220, such as a first trailing edge of the first clock signal TE0-0 222, a second trailing edge TE0-1 224, a third trailing edge TE0-1 226, etc., of the clock signal 220. At TE0-0 222, software thread T0 410 is presented for execution at DE 202. At TE0-1 224, software thread T0 410 is latched and advanced to RF 204 and software thread T1 412 is presented for execution at DE 202. At TE0-2, software thread T) 410 is latched and advanced to EX1 206, software thread T1 412 is latched and advanced to RF 204, and software thread T2 414 is presented for execution at DE 202. Thus, the identification of the number of software threads and allocation of the software threads to hardware threads in the mode control register 302 results in toggling of the instruction pipeline to latch the data signals of software threads T0 410, T1 412, and T2 414 between execution stages according to the first clock signal TE0 220. Again, TE0 may represent the regular, full-speed clock signal generated by a clock generator 170 (FIG. 1) to drive a processing system according to the first clock signal 220.

Figure 5:
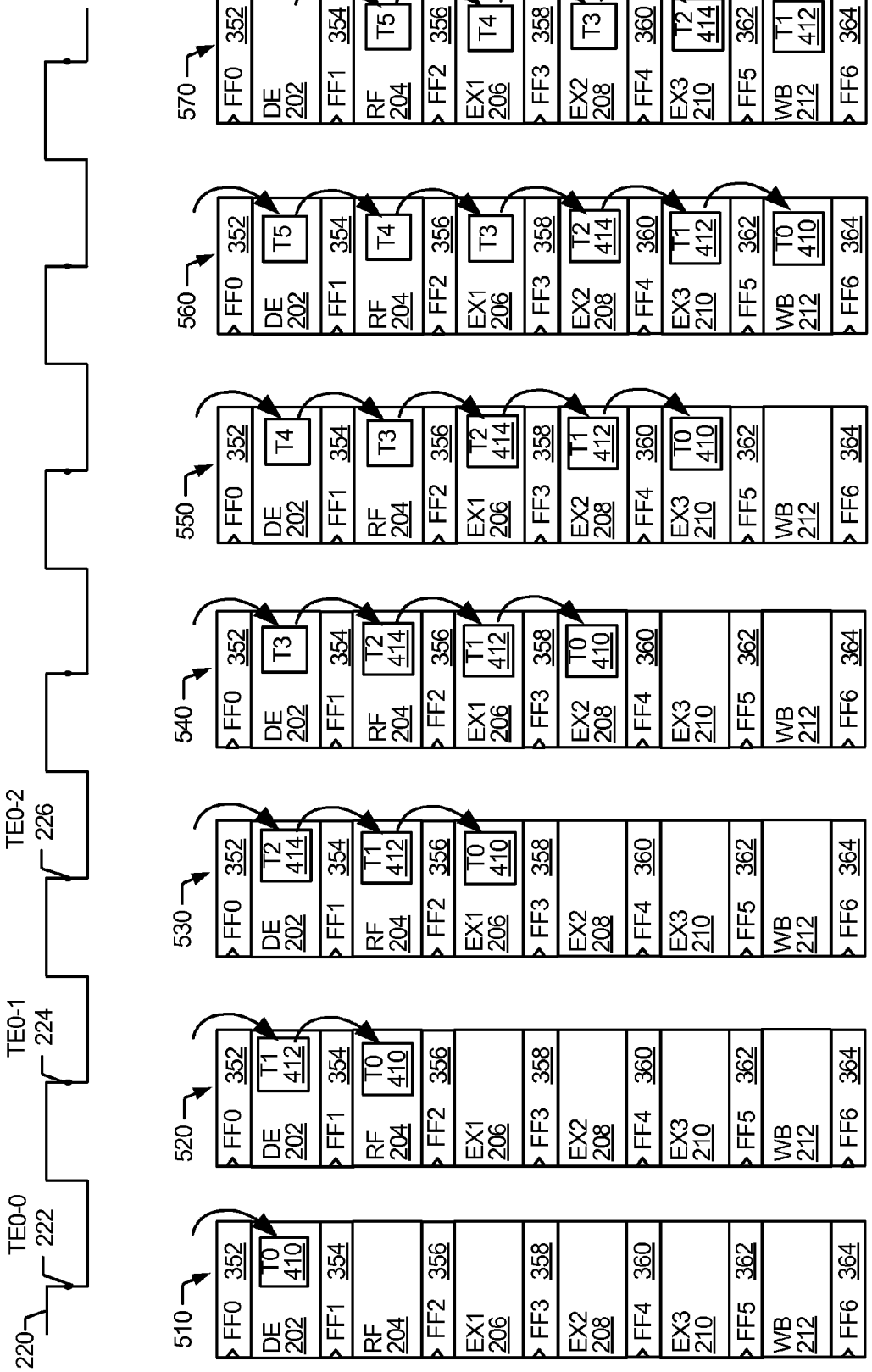
FIG. 5 is a block diagram of an instruction pipeline toggling the hardware threads of FIG. 4 between execution stages according to a clock signal when none of the flip flops are in a transparent mode operating according to a particular embodiment of a method of thread allocation and clock cycle adjustment an interleaved multi-threaded processor.

FIG. 5 illustrates the advancement of the software threads of FIG. 4 through execution stages in states 510, 520, 530, 540, 550, 560, and 570 of an execution pipeline in response to the clock signal 220. The software threads T0 410, T1 412, T2 414, etc., are advanced into and through the execution stages by the plurality of flip flops FF0 352, FF1 354, FF2 356, FF3 358, FF4 360, FF5 362, and FF6 364. According to a particular illustrative embodiment, none of the flip flops FF0 352, FF1 354, FF2 356, FF3 358, FF4 360, FF5 362, and FF6 364 are entered into a transparent state. In a first state 510 initiated by the first trailing edge TE0-0 222, the first flip flop FF0 352 latches the first software thread T0 410 into DE 202. In a second state 520 initiated by the second trailing edge TE0-1 224, the second flip flop FF1 354 latches the first software thread T0 410 into RD 204 while the first flip flop FF0 latches the second hardware thread T1 412 into DE 202. In a third state 530 initiated by the third trailing edge TE0-2 226, the third flip flop FF2 356 latches the first software thread T0 410 into EX1 206 while the second flip flop FF1 latches the second hardware thread T1 412 into RF 204 and the first flip flop FF0 latches the third hardware thread T2 414 into DE 202. In the fourth state 540, the fifth state 550, the sixth state 560, and the seventh state 570, each of the flip flops operate in a non-transparent mode into a next execution stage of the execution pipeline upon the trailing edge of the clock signal 220 which represents a full-speed clock signal. Thus, according to a particular illustrative embodiment, when the number of software threads is more than one-half the number of hardware threads and no software threads may be time-multiplexed, the flip flops fully toggle the hardware threads. In other words, a system that supports reduced toggling also may be configured to operate to fully toggle the hardware threads by sequentially allocating the software threads in the mode control register 302, thereby selectively entering all of the flip flops into a non-transparent mode.

Figure 6:
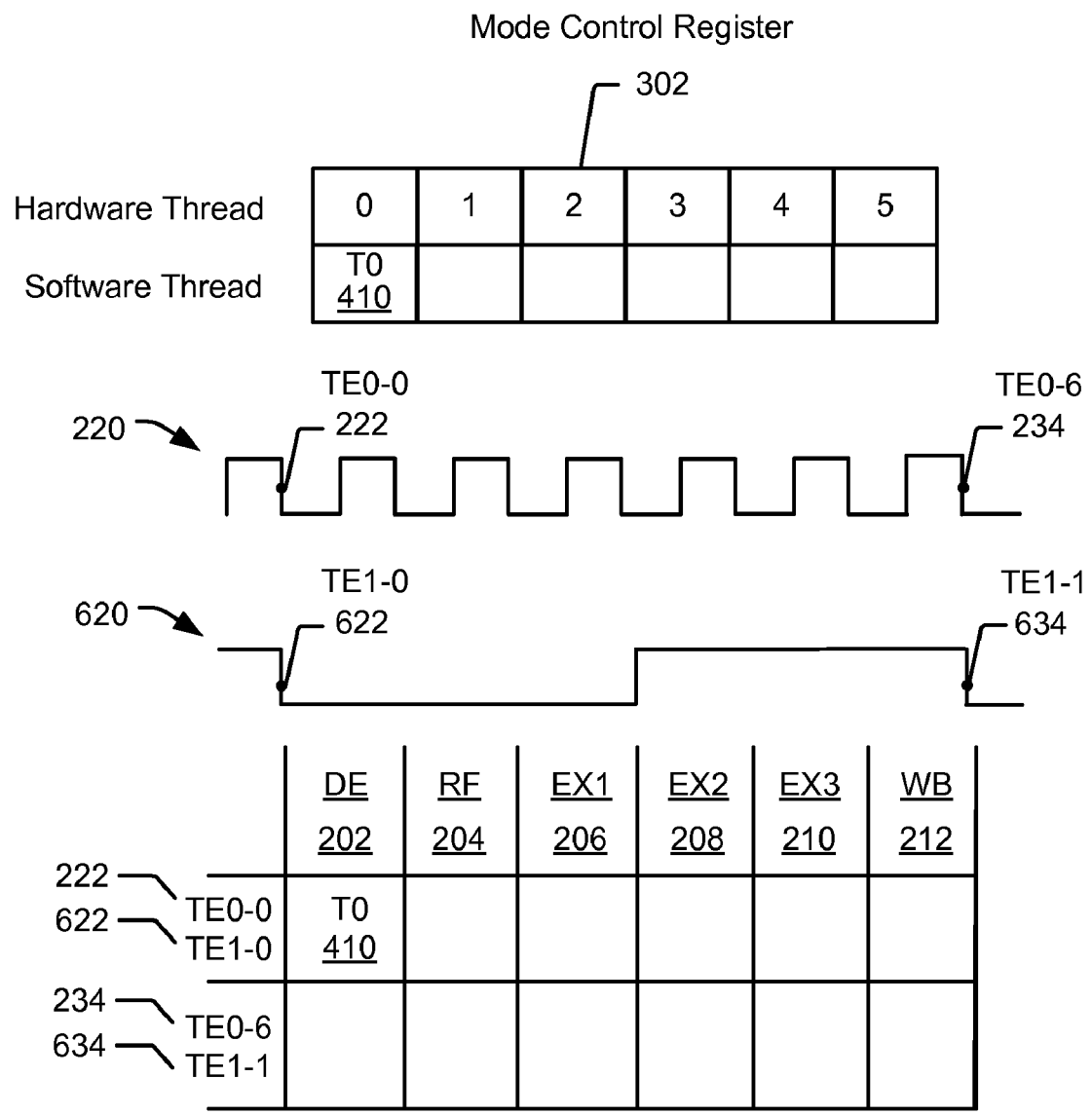
FIG. 6 is a diagram of a mode control register used to selectively allocate one software thread to one of six available hardware threads operating according to a particular embodiment of a method of thread allocation and clock cycle adjustment in an interleaved multi-threaded processor.

FIG. 6 illustrates the allocation of a single software thread, software thread T0 410. According to a particular illustrative embodiment, an operating system or hardware logic identifies that only one software thread is presented for execution. The number of hardware threads is an integer multiple of six times the number of software threads presented for execution (one), and thus is an integer multiple of two or more times the number of hardware threads. Because there are no other software threads executing, if using the first clock signal 220 to toggle the hardware threads, at most, the hardware threads may be toggled to latch the first software thread T0 410 to DE 202 and to latch the first software thread T0 410 out of WB 212. Because no other software threads are executing, the software thread T0 410 may pass between the execution stages in the instruction pipeline unlatched and untoggled. The flip flops used to latch the software threads between execution stages may be entered into a transparent mode to act as buffers between the execution stages, as described below with reference to FIG. 7.

To execute the single software thread T0 410, the hardware threads may be toggled only upon the first trailing edge TE0-0 222 and the seventh trailing edge TE0-6 234 of the clock signal 220. Equivalently, the hardware threads may be toggled by a second clock signal 620 that clocks at one-sixth the frequency of the original clock signal 220. The frequency of the second clock signal 620 is one-sixth that of the clock signal 220 because the number of software threads executing (one) divided by the number of hardware threads (six) is one-sixth. The second clock signal 620 includes trailing edges TE1-0 622 and TE1-1 634 to toggle the hardware threads, which would be equivalent to toggling the hardware threads only at the first trailing edge TE0-0 222 and the seventh trailing edge TE0-6 234 of the clock signal 220. Reducing the clocking of the hardware threads may save power that otherwise might be used in unnecessarily toggling the hardware threads.

Figure 7:
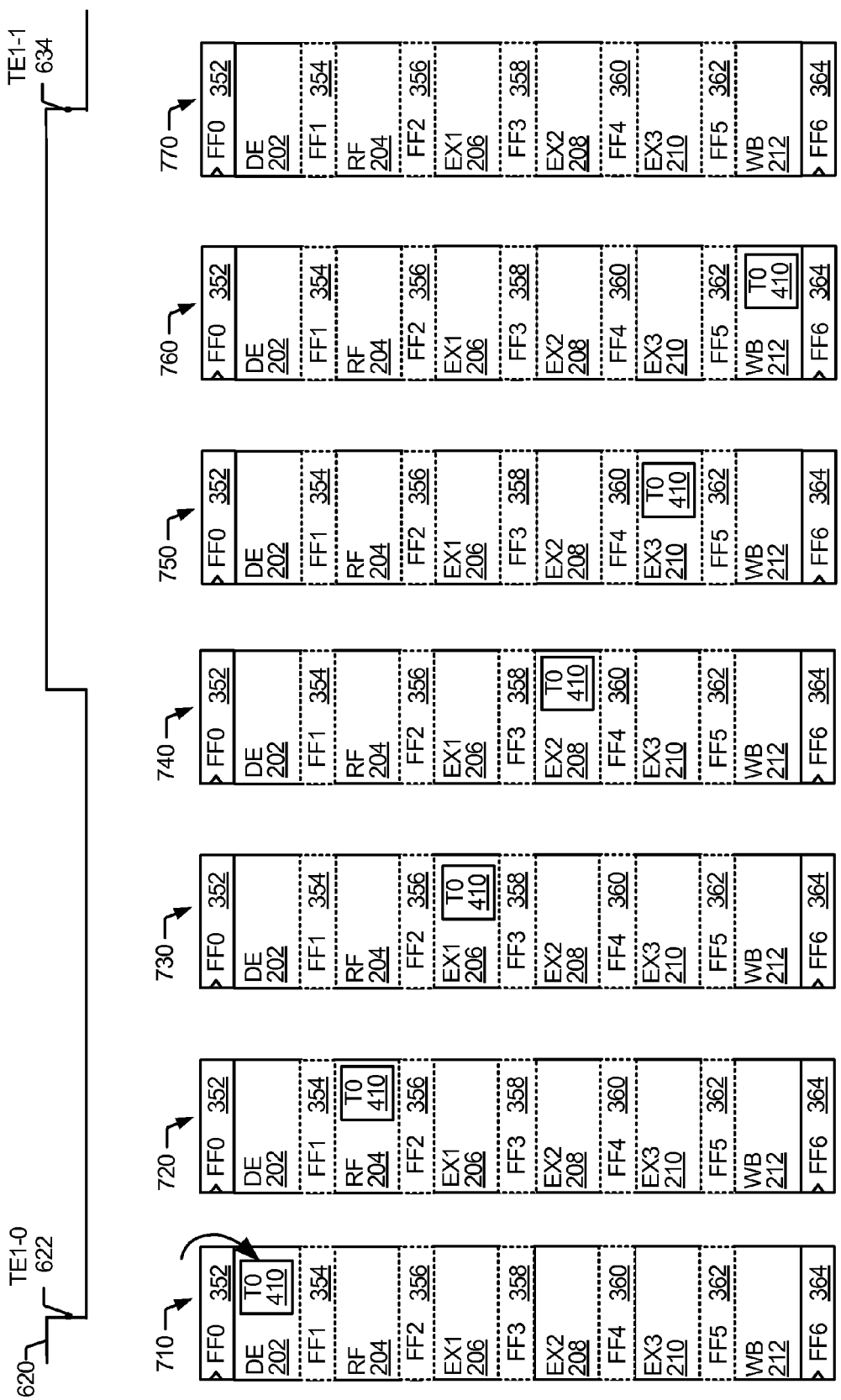
FIG. 7 is a diagram of an instruction pipeline advancing the one software thread of FIG. 6 between execution stages without toggling the hardware threads when multiple flip flops are in a transparent mode operating according to a particular embodiment of a method of thread allocation and clock cycle adjustment in an interleaved multi-threaded processor.

FIG. 7 illustrates the advancement of the software thread T0 410 through execution stages in states 710, 720, 730, 740, 750, 760, and 770 of an execution pipeline in response to the second clock signal 620. Because only a single software thread, T0 410, is executing, the flip flops between execution stages, including FF1 354, FF2 356, FF3 358, FF4 360, and FF5 362 are selectively entered into a transparent state. At TE1-0 622, FF0 352 latches the software thread T0 410 into the instruction pipeline in state 710. However, because no other software threads are executing in states 720-760, between the trailing edges TE1-0 622 and TE1-1 634—when FF6 364 latches the software thread T0 410 out of the instruction pipeline—the software thread T0 410 passes unlatched between the execution stages. The flip flops between the execution stages, including flip flops FF1 354, FF2 356, FF3 358, FF4 360, and FF5 362 are entered into a transparent state as represented by the flip flops FF1 354, FF2 356, FF3 358, FF4 360, and FF5 362 being presented with dotted outlines in FIG. 7. In the transparent state, the flip flops FF1 354, FF2 356, FF3 358, FF4 360, and FF5 362 act as buffers permitting unlatched passage of the software thread T0 410 through the execution stages. By not toggling the hardware threads during execution of the single software thread T0 410, power that would have been consumed in toggling the hardware threads is conserved.

Figure 8:
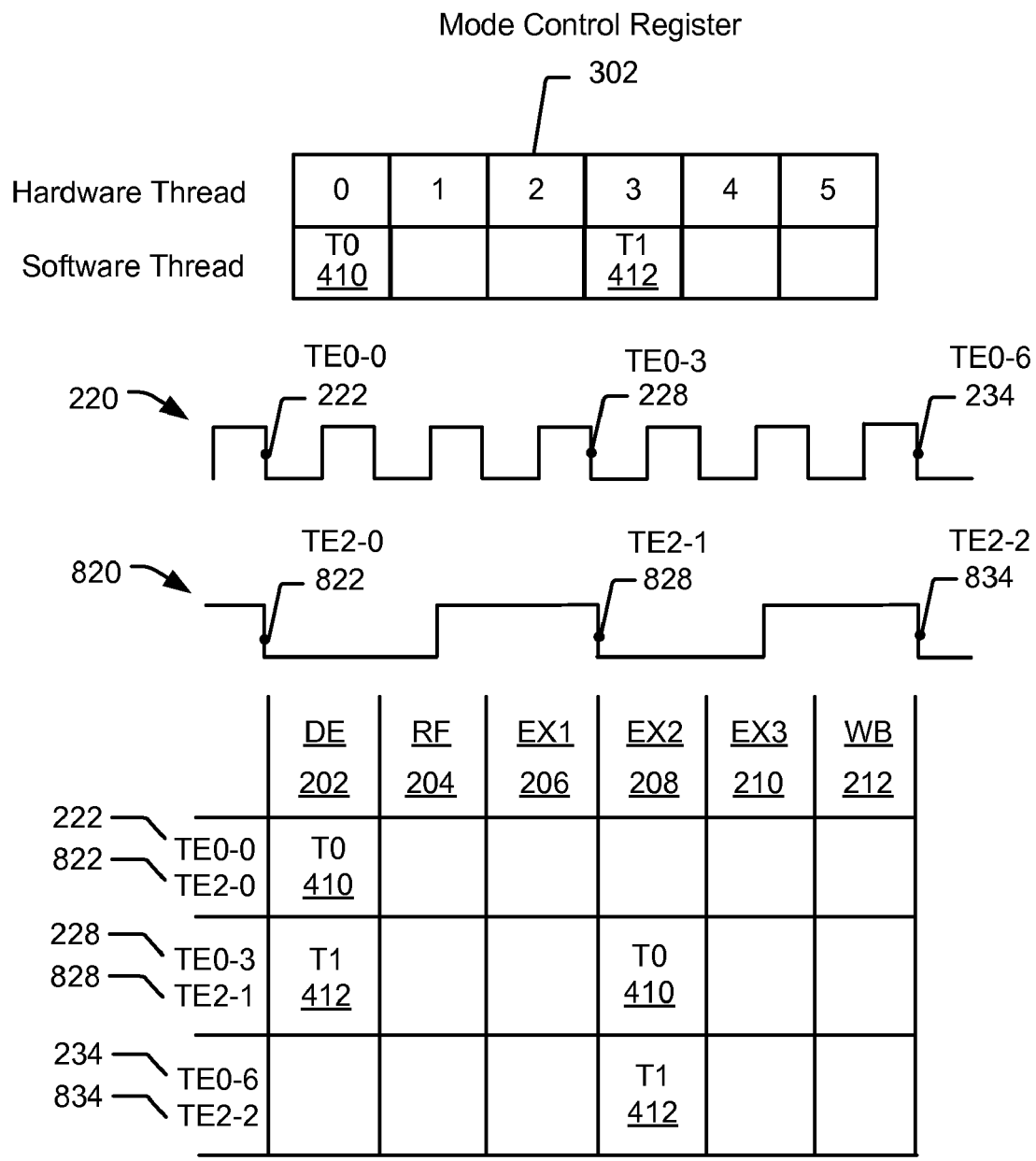
FIG. 8 is a diagram of a mode control register used to selectively allocate two software threads to two non-sequential hardware threads of the six available hardware threads operating according to a particular embodiment of a method of thread allocation and clock cycle adjustment in an interleaved multi-threaded processor.

FIG. 8 illustrates the allocation of two software threads, software thread T0 410 and software thread T1 412 among the hardware threads according to a particular illustrative embodiment. According to a particular illustrative embodiment, an operating system or hardware logic identifies that two software threads are presented for execution among the six hardware threads and assigns the software threads T0 410 and T0 412 to hardware threads in the mode control register 302. In one embodiment, the operating system or logic may non-sequentially assign the software threads so as to be evenly distributed among the hardware threads, leaving two unused hardware threads between the software threads T0 410 and T1 412 upon allocation. Leaving the two unused hardware threads between the software threads T0 410 and T1

412 facilitates reduced toggling of the hardware threads because the unused, open hardware threads need not be latched or clocked, as further described below.

The number of hardware threads (six) is an integer multiple of three times the number of software threads presented for execution (two), and thus is an integer multiple of two or more times the number of hardware threads. Because there are only two software threads executing, if using the first clock signal 220 to toggle the hardware threads, the hardware threads may be toggled to latch the first software thread T0 410 to DE 202, to advance the first software thread T0 410 to EX2 208 and to latch the second software thread T1 412 into DE 202, and to latch the first software thread T0 410 out of WB 212 while advancing software thread T1 412 to EX2 208. Because no other software threads are executing, the software threads T0 410 and T1 412 each may pass unlatched between the execution stages DE 202 and EX1 206 and between the execution stages EX2 208 and WB 212 because no other software threads will execute in those portions of the instruction pipeline due to the selective allocation of the software threads T0 410 and T1 412 leaving open hardware threads between initiation of the respective software threads. The flip flops used to latch the software threads between execution stages DE 202 and EX1 206 and between the execution stages EX2 208 and WB 212 may be entered into a transparent mode to act as buffers between the execution stages, as described below with reference to FIG. 9.

To execute the software threads T0 410 and T1 412, the hardware threads may be toggled only upon the first trailing edge TE0-0 222, the fourth trailing edge TE0-3 228, and the seventh trailing edge TE0-6 234 of the clock signal 220. Equivalently, the hardware threads may be toggled by a third clock signal 820 that clocks at one-third the frequency of the original clock signal 220. The frequency of the third clock signal 820 is one-third that of the clock signal 220 because the number of software threads executing (two) divided by the number of hardware threads (six) is one-third. The third clock signal 820 includes two trailing edges TE2-1 828 and TE2-2 834 to toggle the hardware threads over the span in which the original clock cycle would have included three times as many trailing edges, reducing clocking of the hardware threads to conserve power.

Figure 9:
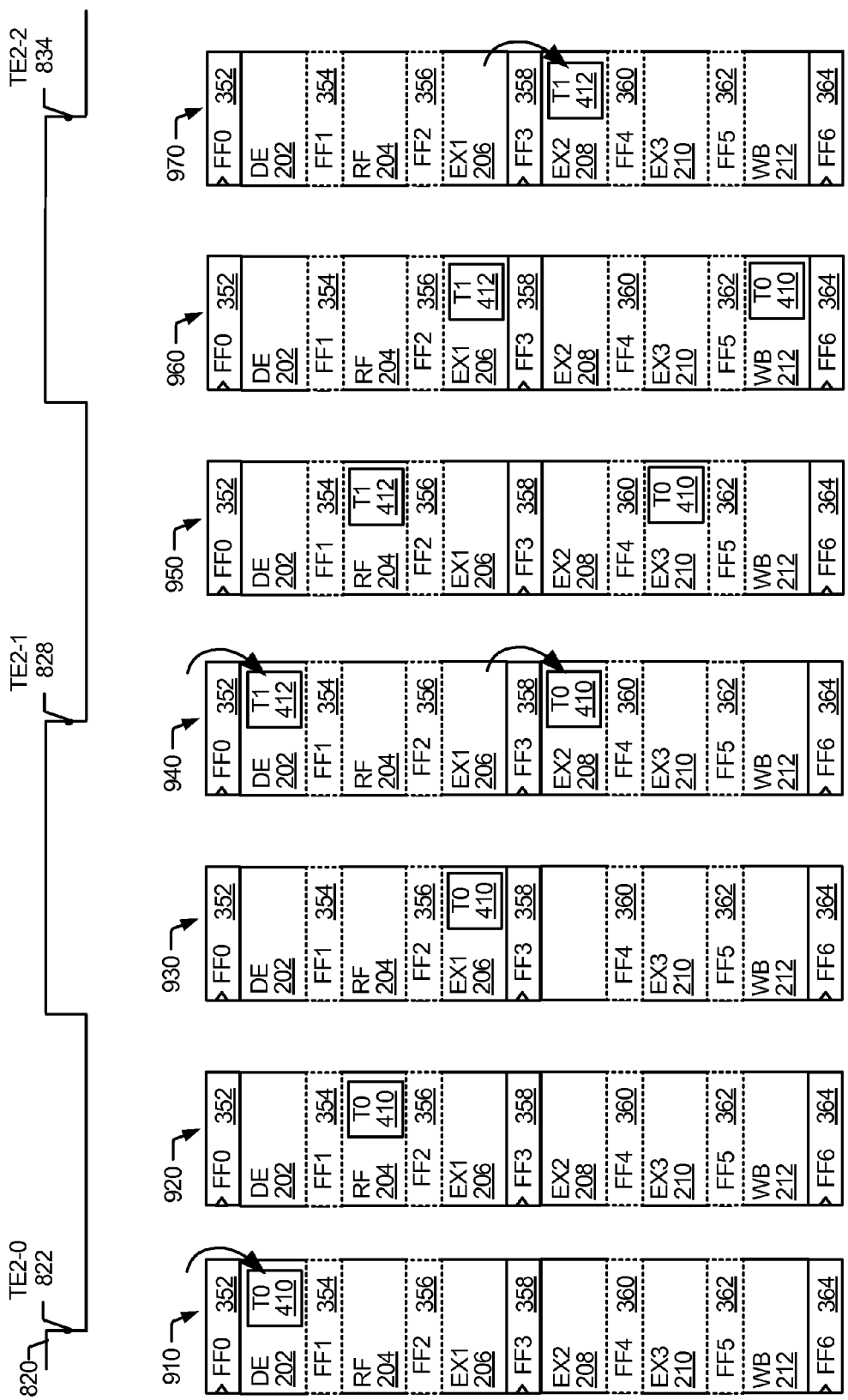
FIG. 9 is a diagram of an instruction pipeline advancing the two non-sequentially allocated software threads of FIG. 8 between execution stages according to a reduced clock signal operating according to a particular embodiment of a method of thread allocation and clock cycle adjustment in an interleaved multi-threaded processor.

FIG. 9 illustrates the advancement of the software threads T0 410 and T1 412 through execution stages in states 910, 920, 930, 940, 950, 960, and 970 of an instruction pipeline in response to the third clock signal 820. Because two software threads T0 410 and T1 412 are executing, the flip flops between execution stages DE 202 and EX1 206, including FF1 354 and FF2 356, and the flip flops between execution stages EX2 208 and WB 212, including FF4 360, and FF5 362, are selectively entered into a transparent state, as represented by the flip flops FF1 354, FF2 356, FF4 360, and FF5 362 being presented with dotted outlines. At TE2-0, FF0 352 latches the software thread T0 410 into the instruction pipeline in state 910. However, because no other software threads are executing, between the trailing edges TE2-0 822 and TE2-1 828—when FF0 352 latches T1 412 into the instruction pipeline at DE 202 and FF3 358 latches T0 410 into EX2 208 in state 940—software thread T0 may pass unlatched between DE 202 and EX1 206 in states 920 and 930. After TE2-1, software thread T0 410 may pass unlatched between EX2 208 and WB 212 while software thread T1 412 may pass unlatched between DE 202 and EX1 206 in states 950 and 960. At TE2-2, FF6 364 latches the software thread T0 410 out of the instruction pipeline while FF3 358 latches the software thread T1 412 into EX2 208. In the transparent state, the flip flops FF1 354, FF2 356, FF4 360, and FF5 362 act as buffers permitting unlatched passage of the software threads T0 410 and T1 412 between the intermediate execution stages. By not latching the flip flops in the transparent state, power that otherwise may be consumed in fully toggling the hardware threads is conserved.

Although FIGS. 8 and 9 illustrate allocation of software threads non-sequentially and evenly distributed among the hardware threads, in other embodiments software threads may be non-sequentially but non-evenly distributed among the hardware threads. Non-even distribution of software threads may also enable a reduced clocking rate and a corresponding reduction of power consumption as compared to a fully allocated pipeline. For example, software threads T0 410 and T1 412 of FIG. 8 may be allocated to hardware threads 0 and 2, respectively, rather than to hardware threads 0 and 3, as depicted in FIG. 8, enabling operation at one-half the frequency of the original clock signal 220.

Figure 10:
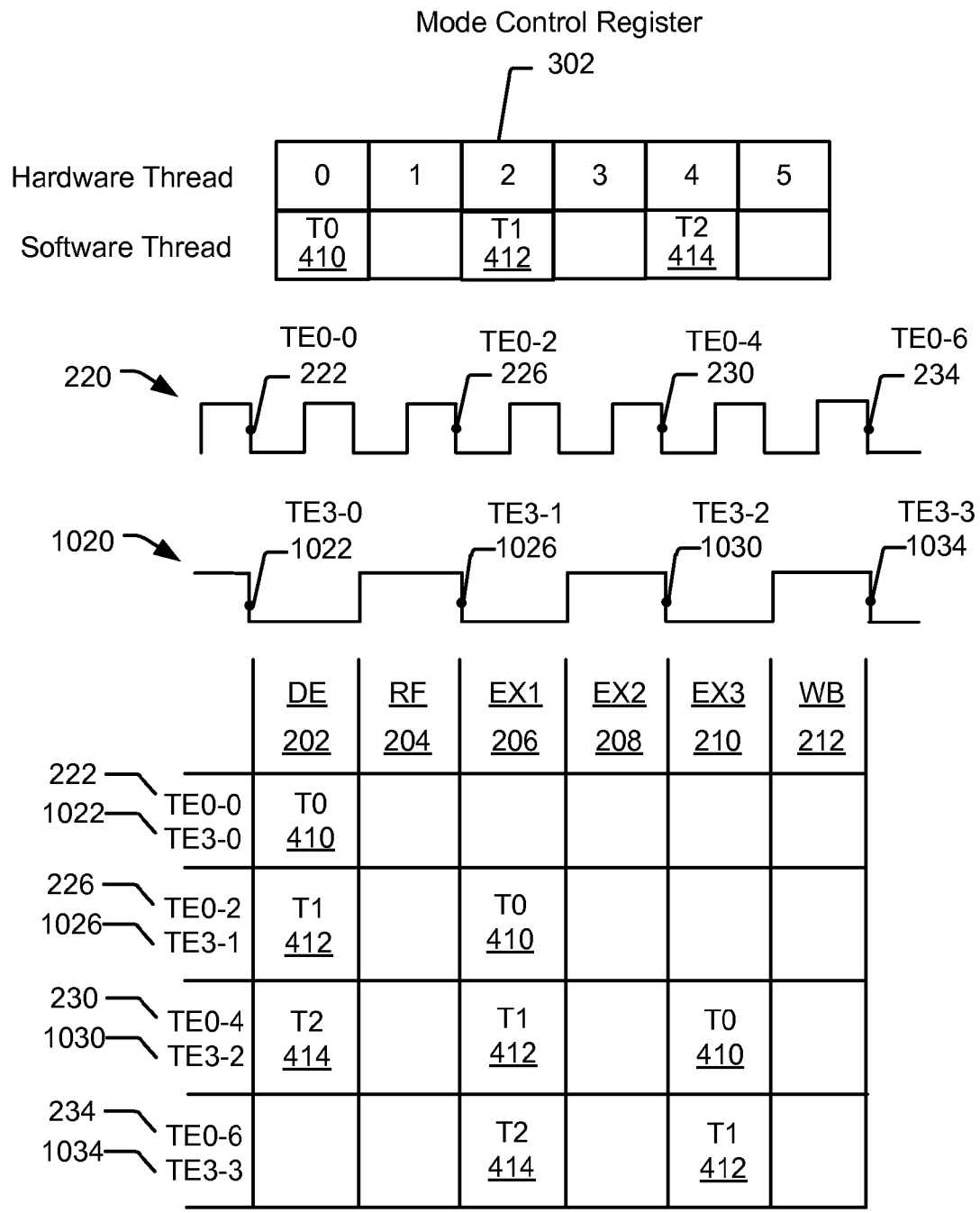
FIG. 10 is a diagram of a mode control register used to selectively allocate three software threads to three non-sequential hardware threads of the six available hardware threads operating according to a particular embodiment of a method of thread allocation and clock cycle adjustment in an interleaved multi-threaded processor.

FIG. 10 illustrates the allocation of three software threads, software thread T0 410, software thread T1 412, and software thread T2 414, among the hardware threads according to a particular illustrative embodiment. According to a particular illustrative embodiment, an operating system or hardware logic identifies that three software threads are presented for execution among the six hardware threads and assigns the software threads T0 410, T1 412, and T2 414 to hardware threads in the mode control register 302. The operating system or hardware logic assigns the software threads so as to be evenly distributed among the hardware threads, leaving one unused hardware thread between each of the software threads T0 410, T1 412, and T2 414 upon allocation. Leaving the unused hardware thread between each of the software threads T0 410, T1 412, and T2 414 facilitates reduced toggling of the hardware threads because the unused, open hardware threads need not be latched or clocked, as further described below.

The number of hardware threads (six) is an integer multiple of two times the number of software threads presented for execution (three), and thus is an integer multiple of two or more times the number of hardware threads. Because there are only three software threads executing, if using the first clock signal 220 to toggle the hardware threads, the hardware threads may be toggled to latch the first software thread T0 410 to DE 202, to advance the first software thread T0 410 to EX1 206 and to latch the second software thread T1 412 into DE 202, and to latch the first software thread T0 410 to EX3 210 while latching the second software thread T1 412 into EX1 206 and latching the third software thread T2 414 into DE 202. Because no other software threads are executing, the software threads T0 410, T1 412, and T2 414 each may pass unlatched between the execution stages DE 202 and RF 204, between the execution stages EX1 206 and EX2 208, and between the execution stages EX3 210 and WB 212. No other software threads will execute in those portions of the instruction pipeline due to the selective allocation of the software threads T0 410, T1 412, and T2 414 leaving open hardware threads between introducing the respective software threads into the instruction pipeline. The flip flops used to latch the software threads between execution stages DE 202 and RF 204, between the execution stages EX1 206 and EX2 208, and between the execution stages EX3 210 and WB 212 may be entered into a transparent mode to act as buffers between the execution stages, as described below with reference to FIG. 11.

To execute the software threads T0 410, T1 412, and T2 414, the hardware threads may be toggled only upon the first trailing edge TE0-0 222, the third trailing edge TE0-2 226, the fifth trailing edge TE0-4 230, and the seventh trailing edge TE0-6 234 of the clock signal 220. Equivalently, the hardware threads may be toggled by a fourth clock signal 1020 that clocks at one-half the frequency of the original clock signal 220. The frequency of the fourth clock signal 1020 is one-half that of the clock signal 220 because the number of software threads executing (three) divided by the number of hardware threads (six) is one-half. The fourth clock signal 1020 includes three trailing edges TE3-1 1026, TE3-2 1030, and TE3-3 1034 to toggle the hardware threads over the span in which the original clock cycle would have included twice as many trailing edges, reducing clocking of the hardware threads to conserve power.

Figure 11:
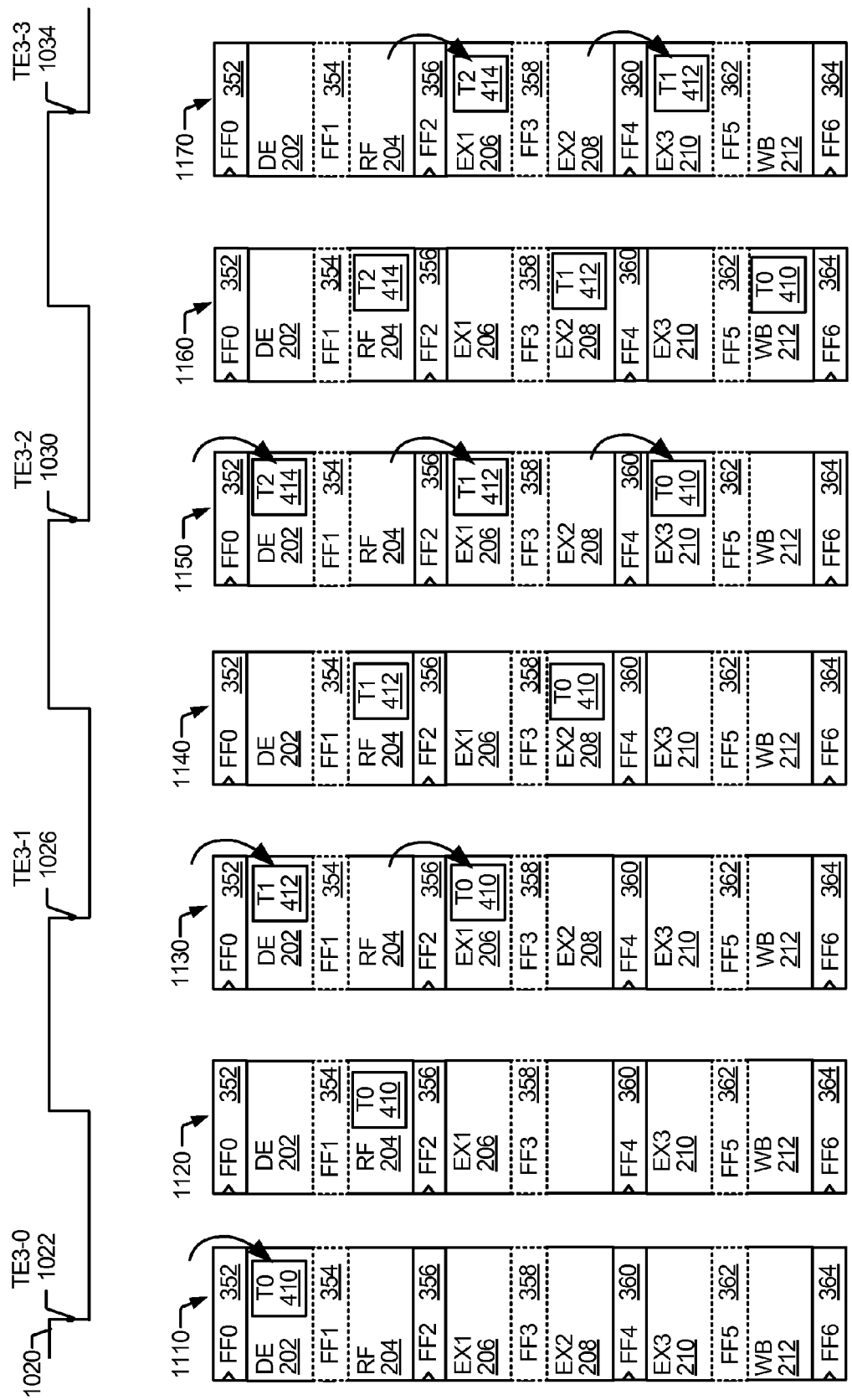
FIG. 11 is a diagram of an instruction pipeline advancing the three non-sequentially allocated software threads of FIG. 10 between execution stages according to a reduced clock signal operating according to a particular embodiment of a method of thread allocation and clock cycle adjustment in an interleaved multi-threaded processor.

FIG. 11 illustrates the advancement of the software threads T0 410, T1 412, and T2 414 through execution stages in states 1110, 1120, 1130, 1140, 1150, 1160, and 1170 of an instruction pipeline in response to the fourth clock signal 1020. Because three software threads T1 410, T1 412, and T2 414 are executing, flip flop FF1 354 between execution stages DE 202 and RF 204, flip flop FF3 358 between execution stages EX1 206 and EX2 208, and flip flop FF5 362 between execution stages EX3 210 and WB 212, are entered into a transparent state, as represented by the flip flops FF1 354, FF3 358, and FF5 362 being presented with dotted outlines. At TE3-0, FF0 352 latches the software thread T0 410 into the instruction pipeline at DE 202 in state 1110. However, because no other software threads are executing, between the trailing edges TE3-0 1022 and TE3-1 1026—when FF0 352 latches T1 412 into the instruction pipeline at DE 202 and FF2 358 latches T0 410 into EX1 206 in state 1130—software thread T0 may pass unlatched between DE 202 and RF 204 in state 1120. After TE3-1, software thread T0 410 may pass unlatched between EX1 206 and EX2 208 while software thread T1 412 may pass unlatched between DE 202 and RF 208 in state 1140. In sum, in states 1120, 1140, and 1160, software threads T0 410, T1 412, and T2 414, may pass unlatched between adjacent execution states. Again, by not latching the flip flops in the transparent state, power that otherwise may be consumed in fully toggling the hardware threads is conserved.

FIG. 12 illustrates the allocation of four software threads, software thread T0 410, software thread T1 412, software thread T2, and software thread T3. As previously described, such as in the example of FIGS. 4 and 5, when the number of hardware threads is not an integer multiple of the number of hardware threads, software threads may be non-sequentially allocated and the flip flops will be operated in a nontransparent mode to fully toggle the hardware threads. However, the operating system, sequencer, or scheduling logic may recognize that, even though the number of hardware threads is not an integer multiple of the number of software threads executing, two or more of the software threads may be identified as not having to be executed at full execution speeds. Such threads may be time multiplexed and combined into one or more single, effective threads. For example, if full execution speed supports 100 millions of instructions per second (MIPS), the software threads may be presented with the execution requirements as given by Table (1):

TABLE 1

| Software Thread | Execution Speed |
|---|---|
| T0 | 100 MIPS |
| T1 | 100 MIPS |
| T2 | 50 MIPS |
| T3 | 50 MIPS |

Thus, in a system where each of the hardware threads is capable of executing at 100 MIPS, software threads T2 and T3 may be time multiplexed and combined into a single, effective software thread T2/T3 1214 that may be executed at a rate enabling both software thread T2 and software thread T3 to execute at a desired execution speed. For example, a sequence of software threads entering the pipeline may be: T0, T1, T2, T0, T1, T3, such that software threads T2 and T3 alternate in the same hardware thread. Alternating software threads T2 and T3 in the same hardware thread satisfies the 50 MIPS execution speed requirement specified for software threads T2 and T3 and also reduces the number of threads presented for execution. At the same time, by combining software thread T2 and software thread T3, there are now twice as many hardware threads as effective software threads, providing for non-sequential allocation of software threads and reduced hardware toggling.

After combining software thread T2 and software thread T3 into a single, time multiplexed software thread, the three remaining effective software threads (i.e., T0, T1, and T2/T3) may be allocated and executed in a substantially similar manner as the three software threads are allocated and executed as described with reference to FIGS. 10 and 11. According to a particular illustrative embodiment, an operating system or hardware logic identifies that three effective software threads are presented for execution among the six hardware threads and assigns the software threads T0 410, T1 412, and T2/T3 1214 to hardware threads in the mode control register 302. The operating system or hardware logic assigns the software threads so as to be evenly distributed among the hardware threads, leaving one unused hardware thread between each of the effective software threads T0 410, T1 412, and T2/T3 1214 upon allocation. Leaving the unused hardware thread between each of the effective software threads T0 410, T1 412, and T2/T3 1214 facilitates reduced toggling of the hardware threads because the unused, open hardware threads need not be latched or clocked, as further described below.

The number of hardware threads (six) is an integer multiple of two times the number of effective software threads presented for execution (three), and thus is an integer multiple of two or more times the number of hardware threads. Because there are only three effective software threads executing, if using the first clock signal 220 to toggle the hardware threads, the hardware threads may be toggled to latch the first software thread T0 410 to DE 202, to advance the first software thread T0 410 to EX1 206 and to latch the second software thread T1 412 into DE 202, and to latch the first software thread T0 410 to EX3 210 while latching the second software thread T1 412 into EX1 206 and latching the third software thread T2/T3 1214 into DE 202. Because no other software threads are executing, the software threads T0 410, T1 412, and T2/T3 1214 each may pass unlatched between the execution stages DE 202 and RF 204, between the execution stages EX1 206 and EX2 208, and between the execution stages EX3 210 and WB 212. No other software threads will execute in those portions of the instruction pipeline due to the selective allocation of the software threads T0 410, T1 412, and T2/T3 1214 leaving open hardware threads between introducing the respective software threads into the instruction pipeline. The flip flops used to latch the software threads between execution stages DE 202 and RF 204, between the execution stages EX1 206 and EX2 208, and between the execution stages EX3 210 and WB 212 may be entered into a transparent mode to act as buffers between the execution stages, as described below with reference to FIG. 13.

To execute the software threads T0 410, T1 412, and T2/T3 1214, the hardware threads may be toggled only upon the first trailing edge TE0-0 222, the third trailing edge TE0-2 226, the fifth trailing edge TE0-4 230, and the seventh trailing edge TE0-6 234 of the clock signal 220. Equivalently, the hardware threads may be toggled by a fourth clock signal 1020 that clocks at one-half the frequency of the original clock signal 220. The frequency of the fourth clock signal 1020 is one-half that of the clock signal 220 because the number of effective software threads executing (three) divided by the number of hardware threads (six) is one-half The fourth clock signal 1020 includes three trailing edges TE3-1 1026, TE3-2 1030, and TE3-3 1034 to toggle the hardware threads over the span in which the original clock cycle would have included twice as many trailing edges, reducing clocking of the hardware threads to conserve power.

FIG. 13 illustrates the advancement of the software threads T0 410, T1 412, and

T2/T3 1214 through execution stages in states 1310, 1320, 1330, 1340, 1350, 1360, and 1370 of an instruction pipeline in response to the fourth clock signal 1020. Because three software threads T1 410, T1 412, and T2/T3 1214 are executing, flip flop FF1 354 between execution stages DE 202 and RF 204, flip flop FF3 358 between execution stages EX1 206 and EX2 208, and flip flop FF5 362 between execution stages EX3 210 and WB 212, are entered into a transparent state, as represented by the flip flops FF1 354, FF3 358, and FF5 362 being presented with dotted outlines. At TE3-0, FF0 352 latches the software thread T0 410 into the instruction pipeline at DE 202 in state 1010. However, because no other software threads are executing, between the trailing edges TE3-0 1022 and TE3-1 1026—when FF0 352 latches T1 412 into the instruction pipeline at DE 202 and FF2 358 latches T0 410 into EX1 206 in state 1330—software thread T0 may pass unlatched between DE 202 and RF 204 in state 1320. After TE3-1, software thread T0 410 may pass unlatched between EX1 206 and EX2 208 while software thread T1 412 may pass unlatched between DE 202 and RF 208 in state 1340. In sum, in states 1320, 1340, and 1360, software threads T0 410, T1 412, and T2/T3 1214, may pass unlatched between adjacent execution states. Again, by not latching the flip flops in the transparent state, power that otherwise may be consumed in fully toggling the hardware threads is conserved.

In time multiplexing the combined software threads T2 and T3 into a combined software thread T2/T3 1214, operations of each of the software threads T2 and T3 may be alternately executed to time multiplex the software threads T2 and T3 to execute as a single execution thread. In this matter, other groups of software threads may comparably be combined into a single, effective software thread to facilitate reduced hardware toggling. For example, if five software threads were presented for execution, but at least four of the five software threads may be executed at half-speed, two pairs of software threads may be combined to execute as two time multiplexed software threads. Similarly, if five software threads were presented for execution, but two of the threads could be executed at one-fourth execution speed and another thread could be executed at one-half execution speed, those three threads could be time multiplexed and combined into a single software thread. Also, if three software threads were presented for execution but two of the software threads could be executed at one-half execution speeds, the two threads could be combined into a single effective software thread. Then, the threads could be allocated and executed as two software threads, allowing hardware toggling to be reduced in speed. Any number of other such combinations is also possible.

FIG. 14 is a flow diagram 1400 of a particular illustrative embodiment of a method for non-sequentially allocating software threads to hardware threads to support reduced toggling. A number of software threads to be allocated is identified, at 1402. A determination is made at 1404 whether a number of software threads is less than a number of hardware threads. If not, regular hardware thread toggling is used, at 1410. However, if the number of software threads is less than a number of hardware threads, at least two of the software threads are allocated to non-sequential hardware threads at 1406. A clock signal to be applied to the hardware threads is adjusted responsive to the non-sequential hardware threads allocated, at 1408. For example, the clock signal may be adjusted at least partially based on the number of software threads allocated among the number of hardware threads.

The examples of FIGS. 4-13 illustrate the operation of the embodiment of the method for non-sequentially allocating software threads to hardware threads to support reduced toggling. For example, FIGS. 4-5 illustrate a case where there are six software threads to be executed. In the case of FIGS. 4-5, the method of FIG. 14 would identify that there are six software threads to be allocated, at 1402. It would be determined that the number of software threads is not less than the number of hardware threads, at 1404. As a result, regular hardware thread toggling may be employed, at 1410.

On the other hand, FIGS. 8-9 illustrate a case where there are two software threads executing. The method of FIG. 14 would identify that there are two software threads to be allocated, at 1402. It would be determined that the number of software threads is less than the number of hardware threads, at 1404. As a result, at least two of the software threads would be allocated to non-sequential hardware threads, at 1406. As shown in FIG. 8, the software threads could be allocated to hardware threads so as to leave two unused hardware threads between the two software threads. The clock signal would be adjusted to be applied to the hardware threads responsive to the non-sequential hardware threads allocated, at 1408. Thus, as described with reference to FIGS. 8-9, because there are non-sequential hardware threads allocated of the six hardware threads and only two software threads executing—leaving one-third the number of software threads executing as there are available hardware threads—the clock signal could be adjusted to one-third of its usual rate.

FIGS. 10-11 illustrate a case where there are three software threads executing. The method of FIG. 14 would identify that there are three software threads to be allocated, at 1402. It would be determined that the number of software threads is less than the number of hardware threads, at 1404. As a result, at least two of the software threads would be allocated to non-sequential hardware threads, at 1406. As shown in FIGS. 10-11, all three of the software threads may be allocated to non-sequential hardware threads, at 1406, leaving an unused hardware thread between each of the software threads. The clock signal would be adjusted to be applied to the hardware threads responsive to the non-sequential hardware threads allocated, at 1408. Because there are six hardware threads and only three software threads executing—leaving one-half the number of software threads executing as there are available hardware threads—the clock signal would be adjusted to one-half of its usual rate.

FIG. 15 is a flow diagram 1500 of another particular illustrative embodiment of a method for non-sequentially allocating software threads to hardware threads to support reduced toggling when one or more software threads may be time multiplexed. A determination is made as to whether there are two or more software threads combinable by time multiplexing, at 1502. As previously described with reference to FIGS. 12 and 13, the execution speed requirements of a software thread may permit two or more software threads to be time multiplexed. For example, as shown in Table (1), the execution speed requirements of software threads T2 and T3 is 50 MIPs, which is one-half the execution speed of a single hardware thread. Thus, threads T2 and T3 are combinable by time multiplexing threads T2 and T3 and alternately presenting instructions of each thread for execution.

If it is determined at 1502 that there are two or more threads that may be time multiplexed, the combinable threads are time multiplexed, at 1504. If it is determined at 1502 that no software threads are combinable, or after combinable threads are time multiplexed at 1504, a number of software threads to be allocated is identified, at 1506. A determination is made at 1508 whether a number of software threads is less than a number of hardware threads. If not, regular hardware thread toggling is used, at 1510. However, if the number of software threads is less than a number of hardware threads, at least two of the software threads are allocated to non-sequential hardware threads at 1512. A clock signal to be applied to the hardware threads is adjusted responsive to the non-sequential hardware threads allocated, at 1514. For example, the clock signal may be adjusted based on the number of software threads allocated among the number of hardware threads.

FIGS. 12-13 illustrate a case where there are four software threads executing where two of the software threads are time multiplexed. The method of FIG. 15 would identify that, because of the reduced execution speed requirements of software threads T2 and T3, there are two software threads that may be time multiplexed, at 1502. Software threads T2 and T3 are time multiplexed, at 1504. With two of the four software threads being time multiplexed at 1504, the number of software threads to be allocated (three) is identified, at 1506. It is determined that the number of software threads (three) is less than the number of hardware threads (six), at 1508. As a result, the use of regular hardware thread toggling, at 1510, is bypassed, and software threads are allocated to non-sequential hardware threads, at 1512. The clock signal to be applied to the hardware threads is adjusted to one-half of the full clock speed responsive to the non-sequential hardware threads allocated, at 1514.

FIG. 16 is a flow diagram 1600 of a particular illustrative embodiment of a method for selectively placing storage elements in a transparent state. At least one storage element in a clocking system is selectively placed in a transparent state to reduce the rate at which hardware threads are toggled, at 1602. The clock signal is configured to be adjustable based on software threads allocated to non-sequential hardware threads of the multi-threaded processor, at 1604. For example, the clock signal may be configured to be adjustable at least partially based on a number of active software threads relative to a number of hardware threads supported by the multi-threaded processor.

FIG. 17 is a block diagram of a particular illustrative embodiment of a communications device 1700 that includes a digital signal processor (DSP) 1710 that includes a clock control system 1764, such as depicted in FIGS. 1-13, using thread allocation, transparent flip flops, and clock cycle adjustment to enable reduced toggling. FIG. 17 also shows a display controller 1726 that is coupled to the digital signal processor 1710 and to a display 1728. Moreover, an input device 1730 is coupled to the digital signal processor 1710. A coder/decoder (CODEC) 1734 can also be coupled to the digital signal processor 1710. A speaker 1736 and a microphone 1738 can be coupled to the CODEC 1734. A video camera 1770 configured to capture still pictures, motion video, or both, may be coupled via a camera interface 1768 to the DSP 1710. The DSP 1710 with its clock control system 1764 may process picture or video data with the advantages of the clock control system 1764 as previously described.

FIG. 17 also indicates that a wireless controller 1740 can be coupled to the digital signal processor 1710 and to a wireless antenna 1742. In a particular embodiment, a power supply 1744 is coupled to the on-chip system 1722. Moreover, in a particular embodiment, as illustrated in FIG. 17, the display 1728, the input device 1730, the speaker 1736, the microphone 1738, the wireless antenna 1742, and the power supply 1744 are external to the on-chip system 1722. However, each is coupled to a component of the on-chip system 1722.

It should be understood that while the clock control system using thread allocation, transparent flip flops, and clock cycle adjustment 1764 is depicted as a separate components of the digital signal processor 1710, the clock control system using thread allocation, transparent flip flops, and clock cycle adjustment 1764 may be otherwise integrated into other components of the digital signal processor 1710, manifested as separate components in the digital signal processor 1710, or otherwise.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices such as the communications device described above with reference to FIG. 17 or in other devices. FIG. 18 depicts a particular illustrative embodiment of an electronic device manufacturing process 1800.

Physical device information 1802 is received in the manufacturing process 1800, such as at a research computer 1806. The physical device information 1802 may include design information representing at least one physical property of a semiconductor device, such as a processor or other semiconductor device using clock control as described with reference to FIGS. 1-13. For example the physical device information 1802 may include physical parameters, material characteristics, and structure information that is entered via a user interface 1804 coupled to the research computer 1806. The research computer 1806 includes a processor 1808, such as one or more processing cores, coupled to a computer readable medium such as a memory 1810. The memory 1810 may store computer readable instructions that are executable to cause the processor 1808 to transform the physical device information 1802 to comply with a file format and to generate a library file 1812.

In a particular embodiment, the library file 1812 includes at least one data file including the transformed design information. For example, the library file 1812 may include a library of semiconductor devices including the clock control system using thread allocation, transparent flip flops, and clock cycle adjustment (shortened to "clock control" in FIG. 18) of FIGS. 1-13 that is provided for use with an electronic design automation (EDA) tool 1820.

The library file 1812 may be used in conjunction with the EDA tool 1820 at a design computer 1814 including a processor 1816, such as one or more processing cores, coupled to a memory 1818. The EDA tool 1820 may be stored as processor executable instructions at the memory 1818 to enable a user of the design computer 1814 to design a circuit using clock control as described with reference to FIGS. 1-13. For example, a user of the design computer 1814 may enter circuit design information 1822 via a user interface 1824 coupled to the design computer 1814. The circuit design information 1822 may include design information representing at least one physical property of a semiconductor device, such as a processor or other semiconductor device using clock control as described with reference to FIGS. 1-13. To illustrate, the circuit design property may include identification of particular circuits and relationships to other elements in a circuit design, positioning information, feature size information, interconnection information, or other information representing a physical property of a semiconductor device.

The design computer 1814 may be configured to transform the design information, including the circuit design information 1822 to comply with a file format. To illustrate, the file formation may include a database binary file format representing planar geometric shapes, text labels, and other information about a circuit layout in a hierarchical format, such as a Graphic Data System (GDSII) file format. The design computer 1814 may be configured to generate a data file including the transformed design information, such as a GDSII file 1826 that includes information describing the clock control as described with reference to FIGS. 1-13, in addition to other circuits or information. To illustrate, the data file may include information corresponding to a system-on-chip (SOC) using clock control as described with reference to FIGS. 1-13 and that also includes additional electronic circuits and components within the SOC.

The GDSII file 1826 may be received at a fabrication process 1828 to manufacture a device using clock control as described with reference to FIGS. 1-13 according to transformed information in the GDSII file 1826. For example, a device manufacture process may include providing the GDSII file 1826 to a mask manufacturer 1830 to create one or more masks, such as masks to be used for photolithography processing, illustrated as a representative mask 1832. The mask 1832 may be used during the fabrication process to generate one or more wafers 1834, which may be tested and separated into dies, such as a representative die 1836. The die 1836 includes a circuit including such as using clock control as described with reference to FIGS. 1-13.

The die 1836 may be provided to a packaging process 1838 where the die 1836 is incorporated into a representative package 1840. For example, the package 1840 may include the single die 1836 or multiple dies, such as a system-in-package (SiP) arrangement. The package 1840 may be configured to conform to one or more standards or specifications, such as Joint Electron Device Engineering Council (JEDEC) standards.

Information regarding the package 1840 may be distributed to various product designers, such as via a component library stored at a computer 1846. The computer 1846 may include a processor 1848, such as one or more processing cores, coupled to a memory 1810. A printed circuit board (PCB) tool may be stored as processor executable instructions at the memory 1810 to process PCB design information 1842 received from a user of the computer 1846 via a user interface 1844. The PCB design information 1842 may include physical positioning information of a packaged semiconductor device on a circuit board, the packaged semiconductor device corresponding to the package 1840 including a processor or other semiconductor device using clock control as described with reference to FIGS. 1-13.

The computer 1846 may be configured to transform the PCB design information 1842 to generate a data file, such as a GERBER file 1852. The GERBER file 1852 or other data file may include data that includes physical positioning information of a packaged semiconductor device on a circuit board. The GERBER file 1852 or other data file may also include information describing layout of electrical connections such as traces and vias, where the packaged semiconductor device includes a processor or other semiconductor device using clock control as described with reference to FIGS. 1-13. In other embodiments, the data file generated by the transformed PCB design information may have a format other than a GERBER format.

The GERBER file 1852 may be received at a board assembly process 1854 and used to create PCBs, such as a representative PCB 1856, manufactured in accordance with the design information stored within the GERBER file 1852. For example, the GERBER file 1852 may be uploaded to one or more machines for performing various steps of a PCB production process. The PCB 1856 may be populated with electronic components including the package 1840 to form a represented printed circuit assembly (PCA) 1858.

The PCA 1858 may be received at a product manufacture process 1860 and integrated into one or more electronic devices, such as a first representative electronic device 1862 and a second representative electronic device 1864. As an illustrative, non-limiting example, the first representative electronic device 1862, the second representative electronic device 1864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1862 and 1864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Notwithstanding, the disclosure is not limited to these exemplary illustrated units.

Thus, a processor or other semiconductor device using clock control as described with reference to FIGS. 1-13 may be fabricated, processed, and incorporated into an electronic device, as described in the illustrative process 1800. One or more aspects of the embodiments disclosed with respect to FIGS. 1-13 may be included at various processing stages, such as within the library file 1812, the GDSII file 1826, and the GERBER file 1852, as well as stored at the memory 1810 of the research computer 1806, the memory 1818 of the design computer 1814, the memory 1850 of the computer 1846, the memory of one or more other computers or processors (not shown) used at the various stages, such as at the board assembly process 1854, and also incorporated into one or more other physical embodiments such as the mask 1832, the die 1836, the package 1840, the PCA 1858, other products such as prototype circuits or devices (not shown), or any combination thereof. Although various representative stages of production from a physical device design to a final product are depicted, in other embodiments fewer stages may be used or additional stages may be included. Similarly, the process 1800 may be performed by a single entity, or by one or more entities performing various stages of the process 1800.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of allocating software threads to hardware threads, the method comprising:
identifying a number of software threads that are to be allocated to a number of hardware threads in an instruction pipeline of an interleaved multi-threaded processor, the number of hardware threads of the interleaved multi-threaded processor being an integer multiple of two or greater of the number of software threads;
determining that the number of software threads to be allocated is not more than one-half the number of hardware threads;
allocating at least two of the software threads to corresponding non-sequential hardware threads, a first software thread being allocated to a first hardware thread and no software thread being allocated to a second hardware thread, in response to determining that the number of software threads is not more than one-half the number of hardware threads; and
after allocating, adjusting a frequency of a clock signal to be applied to the non-consecutive hardware threads.

2. The method of claim 1, wherein the frequency of the clock signal is adjusted at least partially based on the number of software threads to be allocated.

3. The method of claim 1, further comprising allocating at least two of the software threads allocated to corresponding sequential hardware threads conditioned upon determining that the number of software threads is more than one-half the number of hardware threads.

4. The method of claim 1, wherein the software threads include at least one time-multiplexed software thread.

5. The method of claim 1, further comprising causing at least one storage element that receives the clock signal to enter a transparent state for at least one clock cycle.

6. The method of claim 5, wherein the transparent state causes the at least one storage element to act as a buffer of an applied data signal.

7. The method of claim 1, wherein allocating the at least two software threads to corresponding non-sequential hardware threads includes configuring a mode control register assign the at least two software threads to the corresponding non-sequential hardware threads.

8. The method of claim 1, further comprising determining a change in the number of software threads to be allocated and reallocating the software threads to the hardware threads in response to the determination.

9. A method comprising:
an identifying step for identifying a number of software threads that are to be allocated to a number of hardware threads in an instruction pipeline of an interleaved multi-threaded processor, the number of hardware threads of the interleaved multi-threaded processor being an integer multiple of two or greater of the number of software threads;
a non-sequential allocating step for, upon determining that the number of software threads is not more than one-half the number of hardware threads, allocating at least two of the software threads to corresponding non-sequential hardware threads, a first software thread being allocated to a first hardware thread and no software thread being allocated to a second hardware thread; and
an adjusting step for, after allocating, adjusting a frequency of a clock signal to be applied to the non-sequential hardware threads.

10. The method of claim 9, wherein the frequency of the clock signal is adjusted at least partially based on the number of software threads to be allocated among the hardware threads.

11. The method of claim 9, further comprising a sequential allocation step for, upon determining that the number of software threads is more than one-half the number of hardware threads, sequentially allocating the software threads to corresponding sequential hardware threads.

12. The method of claim 9, wherein the adjusting step comprises a setting step for setting a mode control register causing at least one storage element that controls advancement of a data signal to assume a transparent state for at least one clock cycle, wherein the at least one storage element acts as a buffer while the transparent state is assumed.

13. The method of claim 9, further comprising a re-allocating step for re-allocating the software threads to the hardware threads in response to a change in the number of software threads.

14. A non-transitory computer-readable medium storing instructions executable by a computing system to:
identify a number of software threads that are to be allocated to a number of hardware threads in an instruction pipeline of an interleaved multi-threaded processor, the number of hardware threads of the interleaved multi-threaded processor being an integer multiple of two or greater of the number of software threads;
sequentially allocate at least two of the software threads to corresponding hardware threads when the number of software threads is more than one-half the number of hardware threads; and
non-sequentially allocate the software threads to corresponding non-sequential hardware threads when the number of software threads is not more than one-half the number of hardware threads, a first software thread being allocated to a first hardware thread and no software thread being allocated to a second hardware thread.

15. The non-transitory computer-readable medium of claim 14, further comprising instructions executable by the computing system to adjust a frequency of a clock signal to be applied to the hardware threads based on a number of non-sequentially allocated software threads and based on the number of hardware threads.

16. The non-transitory computer-readable medium of claim 15, further comprising
instructions executable by the computing system to cause at least one storage element that controls advancement of a data signal to assume a transparent state for at least one clock cycle, wherein the at least one storage element acts as a buffer while the transparent state is assumed.

17. A system for allocating software threads to hardware threads, the system comprising:
identifying means for identifying a number of software threads to be allocated to a number of hardware threads in an instruction pipeline of an interleaved multi-threaded processor, the number of hardware threads of the interleaved multi-threaded processor being an integer multiple of two or greater of the number of software threads;
determining means for determining that the number of software threads is not more than one-half the number of hardware threads;
allocating means for allocating at least two of the software threads to corresponding non-sequential hardware threads, a first software thread being allocated to a first hardware thread and no software thread being allocated to a second hardware thread, in response to determining that the number of software threads is not more than one-half the number of hardware threads; and clock signal frequency adjusting means for adjusting a frequency of a clock signal to be applied to the corresponding non-sequential hardware threads.

18. The system of claim 17, wherein the frequency of the clock signal is adjusted at least partially based on the number of software threads to be allocated.

19. The system of claim 17, wherein the identifying means is further configurable to identify a plurality of software threads to be time-multiplexed and allocated as a single software thread.

20. The system of claim 17, comprising wherein the identifying means, the determining means, the allocating means, and the clock signal frequency adjusting means are integrated into a device that is selected from the group consisting of a set top box, a music player, a video player, an entertainment unit, a navigation device, a communications device, a personal digital assistant (PDA), a fixed location data unit, and a computer.

21. A method of controlling an interleaved multi-threaded processor, the method comprising:

selectively placing a storage element within a clocking system into a transparent state; and adjusting a frequency of a clock signal based on an allocation of software threads to non-sequential hardware threads in an instruction pipeline of the interleaved multi-threaded processor, the number of hardware threads of the interleaved multi-threaded processor being an integer multiple of two or greater of the number of software threads, wherein the software threads are allocated in response to a determination that a number of the software threads is not more than one-half a number of hardware threads, a first software thread being allocated to a first hardware thread and no software thread being allocated to a second hardware thread.

22. The method of claim 21, wherein the storage element is configurable to control advancement of a data signal such that in response to placing the storage element in the transparent state for at least one clock cycle, the storage element acts as a buffer of the data signal.

23. The method of claim 21, wherein the frequency of the clock signal is adjusted based on a number of active software threads relative to the number of hardware.

24. The method of claim 23, wherein the frequency of the clock signal is determined in response to the number of hardware threads being an integer multiple of the number of active software threads.

25. The method of claim 24, wherein adjusting the frequency of the clock signal comprises reducing the frequency of the clock signal from a first frequency to a reduced frequency.

26. The method of claim 25, wherein the first frequency is the integer multiple of the reduced frequency.

27. The method of claim 23, wherein the number of active software threads includes a time-multiplexed software thread comprising a plurality of the software threads.

28. A system comprising:

an indicator that is configurable to:

identify a number of active software threads to be executed via a number of hardware threads in an instruction pipeline of an interleaved multi-threaded processor, the number of hardware threads of the interleaved multi-threaded processor being an integer multiple of two or greater of the number of software threads; and adjust a frequency of a clock signal;

an allocator that is configurable to allocate the active software threads to the hardware threads, wherein each of at least two of the active software threads is allocated to corresponding non-sequential hardware threads in response to determining that the number of active software threads is not more than one-half the number of hardware threads, a first software thread being allocated to a first hardware thread and no software thread being allocated to a second hardware thread; and at least one storage element that is configurable to assume a transparent state such that the at least one storage element buffers an applied data signal in response to the at least one storage element being in the transparent state.

29. The system of claim 28, wherein the frequency of the clock signal is adjusted based on the number of hardware threads being an integer multiple of the number of active software threads.

30. The system of claim 28, wherein the number of active software threads includes at least one time multiplexed software thread combining that combines a plurality of software threads.

31. The system of claim 28, wherein adjusting the clock signal comprises reducing the frequency of the clock signal to a reduced frequency.

32. The system of claim 28, wherein the at least one storage element comprises at least one flip flop.

33. The system of claim 32, wherein the at least one flip flop comprises a pulsed flip flop.

34. The system of claim 28, further comprising a clocking system, wherein the clocking system comprises a regional clock buffer that is configurable to adjust the frequency of the clock signal and to adjust a plurality of local clock buffers, wherein each of the plurality of local clock buffers is responsive to the regional clock buffer and each of the plurality of local clock buffers controls one or more storage elements.

35. A method comprising:

receiving a data file including design information representing at least one physical property of a semiconductor device, the semiconductor device including:

indicator logic that is configurable to identify a number of active software threads to be executed via a number of hardware threads in an instruction pipeline of an interleaved multi-threaded processor, the number of hardware threads of the interleaved multi-threaded processor being an integer multiple of two or greater of the number of software threads;

allocation logic that is configurable to allocate the active software threads to the hardware threads, wherein at least two of the active software threads are allocated to non-sequential hardware threads in response to determining that the number of active software threads is not more than one-half the number of hardware threads, a first software thread being allocated to a first hardware thread and no software thread being allocated to a second hardware thread; and storage element logic that is configurable to assume a transparent state such that at least one storage element buffers an applied data signal when the at least one storage element is in the transparent state.

36. The method of claim 35, wherein the data file is included in a library of semiconductor devices.

37. The method of claim 36, further comprising providing the library of semiconductor devices for use with an electronic design automation tool.

38. The method of claim 35, wherein the data file has a GERBER format.

39. The method of claim 35, further comprising integrating the semiconductor device into a device selected from the group consisting of a set top box, a music player, a video player, an entertainment unit, a navigation device, a communications device, a personal digital assistant (PDA), a fixed location data unit, and a computer.

* * * * *